(12) United States Patent
Chen et al.

(10) Patent No.: US 10,033,014 B2
(45) Date of Patent: Jul. 24, 2018

(54) ADVANCED LIGHT EXTRACTION STRUCTURE

(71) Applicant: PIXELLIGENT TECHNOLOGIES LLC, Baltimore, MD (US)

(72) Inventors: Zhiyun Chen, Rockville, MD (US); Gregory D. Cooper, Fulton, MD (US)

(73) Assignee: PIXELLIGENT TECHNOLOGIES LLC., Baltimore, MD (US)

( * ) Notice: Subject to any disclaimer, the term of this patent is extended or adjusted under 35 U.S.C. 154(b) by 166 days.

(21) Appl. No.: 14/120,419

(22) Filed: Jul. 8, 2013

(65) Prior Publication Data
US 2015/0380688 A1 Dec. 31, 2015

(51) Int. Cl.
- H01L 35/24 (2006.01)
- H01L 51/52 (2006.01)
- H01L 27/32 (2006.01)

(52) U.S. Cl.
CPC ...... H01L 51/5275 (2013.01); H01L 27/3211 (2013.01); H01L 27/3244 (2013.01)

(58) Field of Classification Search
CPC ............. H01L 51/5237; H01L 51/5275; H01L 27/3211; H01L 27/3244
USPC .............................................. 257/57, 59, 72
See application file for complete search history.

(56) References Cited

U.S. PATENT DOCUMENTS

| | | | |
|---|---|---|---|
| 6,833,667 B2 | 12/2004 | Hamano et al. | |
| 7,164,454 B2 | 1/2007 | Numata et al. | |
| 7,800,100 B2* | 9/2010 | Lee | H01L 27/3244 257/40 |
| 7,936,412 B2 | 5/2011 | Numata et al. | |
| 8,279,535 B2 | 10/2012 | Hsu et al. | |
| 8,767,139 B2 | 7/2014 | Namata et al. | |
| 2002/0084952 A1 | 7/2002 | Morley et al. | |
| 2003/0164679 A1 | 9/2003 | Hamano et al. | |
| 2004/0217702 A1 | 11/2004 | Garner | |
| 2007/0042174 A1 | 2/2007 | Rao | |
| 2008/0079355 A1* | 4/2008 | Smith | H01L 51/5237 313/504 |
| 2011/0080513 A1 | 4/2011 | Hsu et al. | |
| 2011/0262093 A1 | 10/2011 | Lamansky | |
| 2012/0043678 A1 | 2/2012 | Numata et al. | |

(Continued)

FOREIGN PATENT DOCUMENTS

| | | |
|---|---|---|
| CN | 2001821616 | 9/2004 |
| CN | 1960000 | 5/2007 |

(Continued)

OTHER PUBLICATIONS

U.S. Appl. No. 14/903,822, filed Jan. 2016, Chen et al.

(Continued)

Primary Examiner — Samuel Gebremariam
(74) Attorney, Agent, or Firm — Nixon & Vanderhye P.C.

(57) ABSTRACT

Preparation of semiconductor nanocrystals and their dispersions in solvents and other media is described. The nanocrystals described herein have small (1-10 nm) particle size with minimal aggregation and can be synthesized with high yield. The capping agents on thews-synthesized nanocrystals as well as nanocrystals which have undergone cap exchange reactions result in the formation of stable suspensions in polar and nonpolar solvents which may then result in the formation of high quality nanocomposite films.

29 Claims, 23 Drawing Sheets

(56) References Cited

U.S. PATENT DOCUMENTS

2012/0099323 A1*  4/2012  Thompson .......... H01L 51/5275
                                                    362/257
2012/0223873 A1   9/2012  Ohta
2016/0149163 A1   5/2016  Chen et al.

FOREIGN PATENT DOCUMENTS

| CN | 102844904 | 12/2012 |
| JP | 2003-031782 A | 1/2003 |
| WO | WO 2008/026862 A1 | 3/2008 |
| WO | WO 2015/006276 A1 | 1/2015 |

OTHER PUBLICATIONS

International Search Report & Written Opinion dated Nov. 24, 2014, in connection with PCT/US2014/045671.
Office Action (English translation) dated Jul. 24, 2017 received in CN201480049299.8 (Pixelligent Technologies LLC; Apr. 2016; Advanced Light Extraction Structure).
Office Action dated Jun. 15, 2017 received in U.S. Appl. No. 14/903,822 (Chen et al; Title: Advanced Light Extraction Structure; filed Jan. 8, 2016).
Claims filed Mar. 7, 2017 in copending U.S. Appl. No. 14/903,822 (Chen et al, "Advanced Light Extraction Structure", filed Jan. 8, 2016).

* cited by examiner

ADVANCED LIGHT EXTRACTION STRUCTURE

STATEMENT REGARDING FEDERALLY SPONSORED RESEARCH OR DEVELOPMENT

This work was supported in part by Department of Commerce Cooperative Agreement Nos. 70NANB7H7014 and 70NANB10H012 and the National Science Foundation grant no. 0724417.

CROSS-REFERENCES TO RELATED APPLICATIONS

This application is related to and incorporates by reference herein U.S. Provisional Application No. 61/790,156, filed Mar. 15, 2013.

FIELD OF THE INVENTION

This invention relates Organic Light Emitting Diodes (OLEDs), more particularly it relates to Active Matrix OLED (AMOLED) display light extraction.

BACKGROUND AND SUMMARY OF THE INVENTION

Light Emitting Diodes (LEDs) and Organic Light Emitting Diodes (OLEDs) have enjoyed a rapid development in the past couple of decades and have started to replace existing lighting and display devices. Due to the specific device structures of LEDs and OLEDs, significant portion of the light generated inside the active region is totally reflected at various interfaces and is "trapped" inside the device, leads to reduced efficacy of the light emitting device.

The problem is particularly severe for OLED given the technology is in a much early development stage than its LED counterpart. For example, only ~20% of all the photons generated in an OLED lighting device are extracted out. Many light extraction schemes have been applied to LEDs and OLEDs, such as backside reflector, high refractive index encapsulant, surface roughening or surface texturing, etc. Textured extraction film is a popular solution for OLED lighting as it is compatible with the roll-to-roll manufacturing process and can be easily applied on either side of the final encapsulation layer.

A pedagogical depiction of the device structure of a typical OLED device with textured surface is shown in FIG. 1. The active area (101) emits light, for both a top emitting and bottom emitting device structure, through a transparent conductor, such as an Indium Tin Oxide (ITO), layer (102) and the substrate (103), which is surface textured (104) to reduce the light loss due to total internal reflection at the substrate/air interface.

In an Active Matrix OLED (AMOLED) display, however, due to pixelated nature of the active region, the surface texture degrades the optical quality of the pixels, creating an undesirable blur effect.

In one aspect of this invention, we describe a light extraction structure that can be placed immediately on top of, or in close vicinity, of the active region, is described. Such a structure can improve the light extraction of the AMOLED display and at the same time preserve the optical quality of the pixels.

BRIEF DESCRIPTION OF THE DRAWINGS

These and other features and advantages will be better and more completely understood by referring to the following detailed description of presently preferred illustrative embodiments in conjunction with the drawings, of which.

DETAILED DESCRIPTION OF PRESENTLY PREFERRED EXAMPLE ILLUSTRATIVE NON-LIMITING EMBODIMENTS

A first exemplary embodiment of a light extraction structure may comprises an array of lenses or set of lenses, said array of lenses or sets of lenses comprise a high refractive index material having refractive index higher than the encapsulation layer or the substrate, each said lens or set of lenses is applied between the active region of a light emitting device and the encapsulation layer of said light emitting device, each said lens or set of lenses covers at least one pixel, a planarization layer between said array of lenses or sets of lenses and said encapsulation or substrate layer, said light extraction structure enhances the overall extraction efficiency of light generated by the active region to the viewer or the external light detector.

Figure 2:
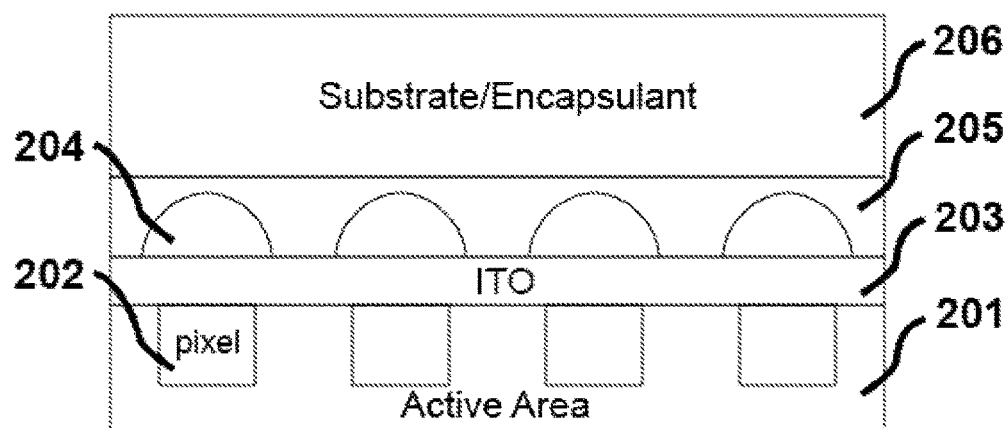
FIG. 2 shows an exemplary AMOLED device structure of current invention.

An illustrative depiction of this embodiment is shown in FIG. 2. The active layer (201) is divided into an array of pixels (202). The light emitted from the pixels may go through a thin ITO layer (203) and the lenses (204). A planarization layer (205) may be applied to reduce air trapped between the lenses and the substrate, promote better adhesion, and provide refractive index matching. And finally the light transmits out of the substrate (206).

Said light emitting device in the exemplary embodiment of a light extraction structure may comprise light emitting diode (LED), organic-light emitting diode (OLED), electroluminescence device, or liquid crystals device (LCD).

In order for such a structure to improve light extraction efficiency, the lens material has to meet stringent requirements: compatibility with current process and material system, higher refractive index than the substrate or encapsulant, and high optical transparency in the visible spectrum.

When the size of the inorganic nanocrystals is smaller than one tenth of the wavelength of the light, the scattering by the nanocrystals is negligible.

Therefore, high refractive index, high transparency nanocomposites can be achieved by dispersing inorganic nanocrystals with high refractive index into polymeric materials with relatively lower refractive index, and at the same time meets the processability requirements of the manufacturing process.

One example of such a high refractive index nanocomposite is disclosed in U.S. Provisional Application No. 61/790,156, incorporated herein by reference. In this material system, Pixelligent's proprietary mono-dispersed sub-10 nm $ZrO_2$ nanocrystals with surface capping agents are dispersed in acrylic monomers, and can be further cured with UV-light to form a high refractive index coating.

Said high refractive index material of the exemplary light extraction structure may comprise a nanocomposite, said nanocomposite comprises inorganic nanocrystals and a polymeric matrix.

Said nanocomposite may be UV curable.

Said nanocomposite may be thermally curable.

Said nanocrystals may comprise $ZrO_2$, $TiO_2$, ZnO, MgO, $HfO_2$, $Nb_2O_5$, $Ta_2O_5$, or $Y_2O_3$. These inorganic materials possess both high refractive index and transparency at visible spectrum.

Said nanocrystals may have size smaller than I 0 nm in at least one dimension.

Said polymer matrix may comprise acrylic, epoxy, silicone, siloxane, polycarbonate, polyurethane, polyimides, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene), and their corresponding monomers and/or oligomers.

Each said lens or set of lenses of the exemplary light extraction structure may cover a single pixel of the light emitting device.

Each said lens or set of lenses of the exemplary light extraction structure may cover multiple pixels of the light emitting device.

Each said lens or set of lenses of the exemplary light extraction structure may comprise a single lens element, said lens element may comprise spherical, semi-spherical, hyper-hemispherical, parabolic, concave, convex, sub-wavelength pyramid array, surface texture, or any other surface curvature.

Each said lens or set of lenses of the exemplary light extraction structure may comprise a single lens element, said lens element comprises a graded or gradient index profile along at least one dimension of the lens, said graded or gradient lens may comprise curved surface.

Each said lens or set of lenses of the exemplary light extraction structure may comprise multiple lens elements, said lens elements may comprise singlet lens, lens with graded or gradient index profile, achromatic lens doublet, prism, filter, polarizer, reflector, or any other common optical elements.

Each said lens or set of lenses of the exemplary light extraction structure may be separated from the active region of said light emitting device by less than the wavelength of the highest energy photons emitted by said light emitting device.

Another exemplary method of making of a light extraction structure for a light emitting device comprises: an active region, an array of lenses or set of lenses, said array of lenses or sets of lenses comprise a high refractive index material having refractive index higher than the substrate or the encapsulation layer, said lenses or sets of lenses are applied between the active region of a light emitting device and the encapsulation layer of said light emitting device, a planarization layer between said array of lenses or sets of lenses and said encapsulation or substrate layer, said light extraction structure enhances the overall extraction efficiency of light generated by the active region to the viewer or the external light detector.

Said applying in the exemplary method of making a light extraction structure comprises applying a prefabricated sheet comprising the said array of lenses or sets of lenses on top of the active region of said light emitting devices.

Said applying a prefabricated sheet may comprise roll-to-roll printing.

Said applying in the exemplary method of making a light extraction structure comprises applying a layer of said high refractive index materials on top the active regions, by spin-coating, dip-coating, blade coating, draw-bar coating, slot-die coating, spraying, or any other common coating techniques, and then forming said array of lenses or set of lenses through imprint lithography, optical lithography, or any other common patterning techniques.

Said apply in the exemplary method of making a light extraction structure comprises UV curing.

Said apply in the exemplary method of making a light extraction structure comprises thermal curing.

EXAMPLES

One example light extraction structure comprises an array of hyper hemispherical, lens centered on an active region.

Figure 3:
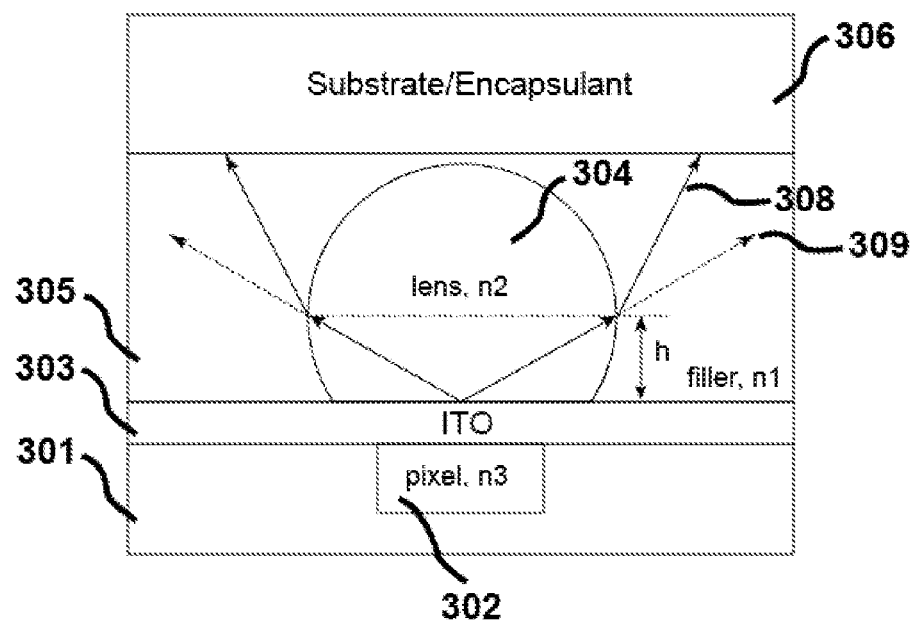
FIG. 3 shows an exemplary OLED pixel of current invention using a hyper-hemispherical lens.

For illustration purpose, one unit of such a structure is shown in FIG. 3. The structure is similar to FIG. 2, the active region (301) is divided into pixels (302). For simplicity, only one pixel is shown here. The pixel or pixels having a refractive index of n3. An ITO layer (303) may exist between the pixel and the lens. The lens is shaped into a hyper-hemi-sphere (304) with h=R/n2, where R is the radius of the hemisphere and n2 is the refractive index of the lens, also known as Weierstrauss geometry. A filler, or a planarization layer (305), with refractive index n1, may be applied between the lens and the substrate (306).

In the case n3>n2>n1, it can be shown with simple ray tracing, that for both hyper hemispherical and spherical, which is a special case with h=0, lenses can significantly improve the light extraction from the pixels. And the geometry with h=R/n2 offers the highest collection efficiency. The hyperhemispherical lens offers an extra benefit in that for an emitter located at the center of the lens, it focuses the emitted light to a smaller solid angle, as shown in FIG. 3. 309 represents the rays without any lens or with a spherical lens, while 308 represents the rays after the hyper hemispherical lens. For an optical system with a limited numerical aperture, in this case the numerical aperture is limited by the total internal reflection at the substrate/air interface, this ability makes hyper hemispherical lens efficient in coupling into the substrate/air interface escape cone.

Figure 1:
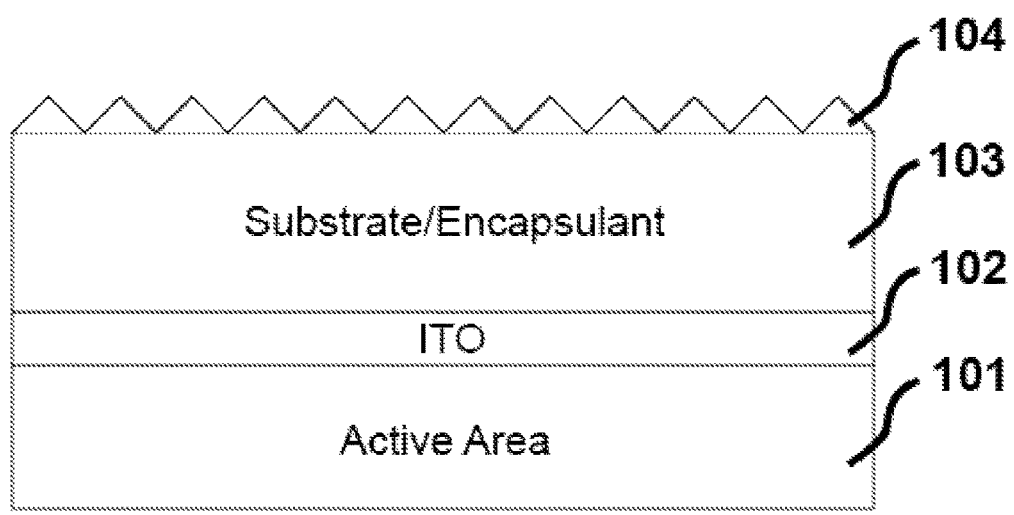
FIG. 1 shows an exemplary AMOLED device structure with textured surface.

Another example light extraction structure comprises an array of hemispherical lens centered on an active region, in a similar structure as in FIG. 2, with 204 being hemispherical lenses. Such a system provides higher light coupling compared with the system in FIG. 1 without surface texturing (104).

Another example light extraction structure comprises an array of hypo-spherical lens centered on an active region, in a similar structure as in FIG. 2, with 204 being hypo-spherical lenses. In hypo-spherical lens, h is negative. Such a system still provides higher light coupling compared with the system in FIG. 1 without surface texturing 104)

Polymeric coating materials described herein exhibit high optical transmittance in the visible spectrum. The materials of the present disclosure may be easily coated onto the surface of desired substrates via common coating processes, such as by spin coating, screen printing, dip, roll-to-roll, slot die, draw bar, or spray coating, for many electronic applications. The thickness of coatings described herein may range from tens of nanometers to millimeters, as may be required for specific applications. The materials of the present disclosure are unique in additionally providing a high refractive, high transparency film or coating or layer, as may be desirable in electronics applications where light coupling is important to the performance.

For example, in a traditional Organic Light Emitting Diode (OLED), only ~30% of light generated is emitted to the environment, while the remaining light is generally lost in the device. A high percentage of this loss is due to the low refractive index (RI) of the encapsulation materials. A high refractive index high transparency organic coating, with a refractive index around 1.8 or higher, as may be produced with a material of the present disclosure, may dramatically enhance the efficacy of the OLED lighting and display devices including same. High refractive index coatings of the present disclosure will also be advantageously incorporated in other devices, such as light emitting diode (LED) lighting, light emitting diode (LED) displays, touch screens, sensors, and solar cells.

The presently disclosed materials include various metal oxides, such as zirconium oxide, titanium oxide, hafnium oxide, and zinc oxide, have high bulk refractive indexes, typically larger than 2 in the visible spectrum, as well as exceptional transparency. In many electronic applications, the high cost, high temperature processing conditions required and the rigid and brittle nature of the inorganic metal oxide coatings have limited their use in the art.

By combining the organic coating materials of the present disclosure with metal oxide nanocrystals as described herein, the presently described materials make it possible to produce easily processable unique flexible and thin film coatings with a high refractive index and high optical transparency.

As described herein, nanocrystals of the present disclosure have diameters much smaller than the wavelength of the light to minimize light scattering, while also maintain dispersibility or agglomeration-free in an organic or polymer or monomer matrix. Such physical characteristics of the presently disclosed materials not only reduce light scattering but also make for an exceptional processability.

The nanocrystals of the presently described material include specific functional group, also referred to as capping agents, or capping groups. These specific functional groups have been grafted to the surface of the nanocrystals. Such nanocrystals are described herein as well as in U.S. patent application Ser. No. 13/064,905 (filed Apr. 25, 2011 and published as US 2012-0088845A1 on Apr. 12, 2012—Williams et al), the entire content of which is incorporated herein by reference. The disclosure of U.S. patent application Ser. No. 13/064,905 is included herewith and is a part of the present disclosure.

Exemplified capping agents demonstrated in the present disclosure include 2-[2-(2-9-methoxyethoxy) ethoxy]acetic acid and/or methoxy(triethyleneoxy) propyltrimethoxysilane and/or 3-methacryloyloxypropyltrimethoxysilane and/or n-octyl trimethoxysilane and/or dodecyltrimethoxysilane and/or m,p-ethylphenethyl trimethoxysilane.

Capping of nanocrystals may require a solvent exchange as as-synthesized nanocrystals may be surface modified in a solvent other than the solvent of nanocrystals synthesis. Solvent exchange may be accomplished by, for example, decanting reaction liquor and rinsing the nanocrystals with the capping solvent, which may then be used as a washing or rinsing solvent that is itself decanted to produce a wet cake of uncapped nanocrystals.

For example to perform the surface modification of the nanocrystals with 2-[2-(2-9-methoxyethoxy) ethoxy]acetic acid, the nanocrystals are suspended in the capping solvent, for example, toluene for 2-[2-(2-9-methoxyethoxy) ethoxy] acetic acid modification, preferably at a loading of 10 wt % or greater, more preferably 20 wt % or greater, still more preferably, 30 wt % or greater, calculated based on the weight of the wet nanocrystal cake. While the suspension is being stirred, the capping agent is added to it slowly. The amount of capping agent used is 8-60 wt % to the weight of the wet nanocrystal cake. The suspension is allowed to stir at 20-27 C for 10-30 minutes and then refluxed at the boiling point of the capping solvent for 30-60 minutes. After refluxing, the clear solution is cooled to 50-60 C slowly. This suspension is then filtered to remove dust and aggregates bigger than 200 nm. The capped nanocrystals are then precipitated out from the capping solvent using heptane. The precipitated nanocrystals are collected by centrifugation. The nanocrystals thus collected are dispersed in tetrahydrofuran (THF) and again re-precipitated using heptane. This process is repeated twice. The wet cake of nanocrystals collected in the final step is dried under vacuum.

The presently disclosed material or formulation may also be made as a solvent free formulation or as a formulation or material with a low or reduced solvent content. Such low or no solvent materials are desirable both because of environmental and health purposes and because of processing constraints and/or limitations.

The nanocrystals of the present disclosure therefore are uniquely dispersible directly into an organic material without the need or requirement for solvent(s).

Metal oxide nanocrystals of the present disclosure are, for example, mono-dispersible, with an average size range of 3-7 nm, and containing a surface treatment that aids in dispersion of the nanocrystals in a large variety of solvents and polymers. The presently disclosed material advantageously does not require the inclusion of solvents and the nanocrystals of the present disclosure are dispersible in the polymer and/or monomer material of the present disclosure, without the inclusion of solvents or additional dispersing agents. These nanocrystals, which have been surface modified with capping agents, possess greater compatibility with monomers and/or oligomers and/or polymers without reduction in processability. The surface modified nanocrystals of the present application may be formulated in a resin mixture that is transparent and has a viscosity that allows spin coating of, for example, 3-4 micron thick films. The films of the present disclosure additionally demonstrate high refractive index, high optical transmittance in the visible spectrum, and are thermally stable at temperatures above 120 C, or above 175 C, or above 200 C.

The films according to the present disclosure possess a high refractive index of 1.6 and higher at 400 nm, or 1.7 and higher at 400 nm, or 1.8 and higher at 400 nm, or 1.9 at 400 nm. The refractive index of the films according to the present disclosure may range from 1.6 to 1.9 at 400 nm.

Figure 4A:
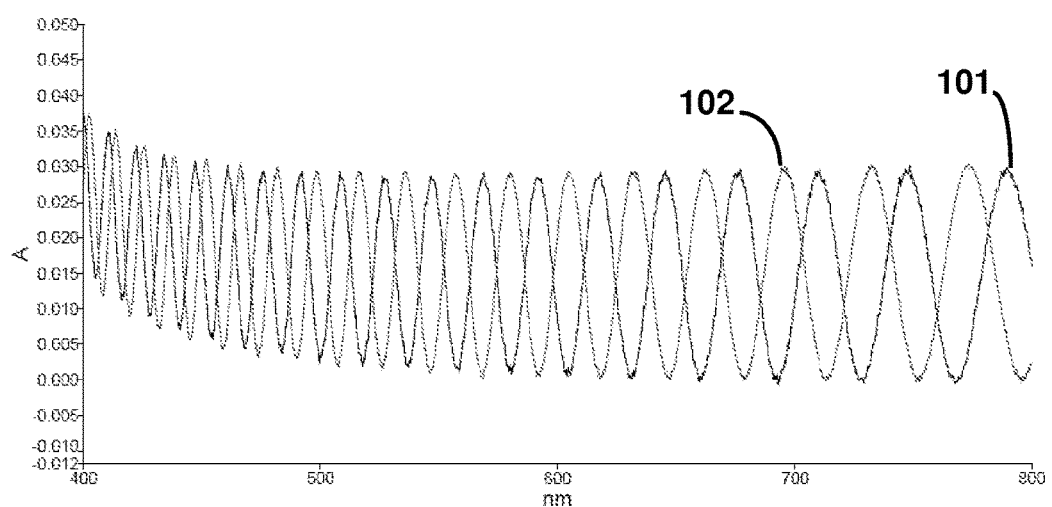
FIG. 4a UV absorption spectrum of film from formulation ($ZrO_2$(2-[2-(2-9-methoxyethoxy) ethoxy]acetic acid) in 70:30 BMA-TMPTA) after post bake at (101) 120 C for 3 minute in air, (102) thermal bake at 175 C for 1 hour under $N_2$.
Figure 4B:
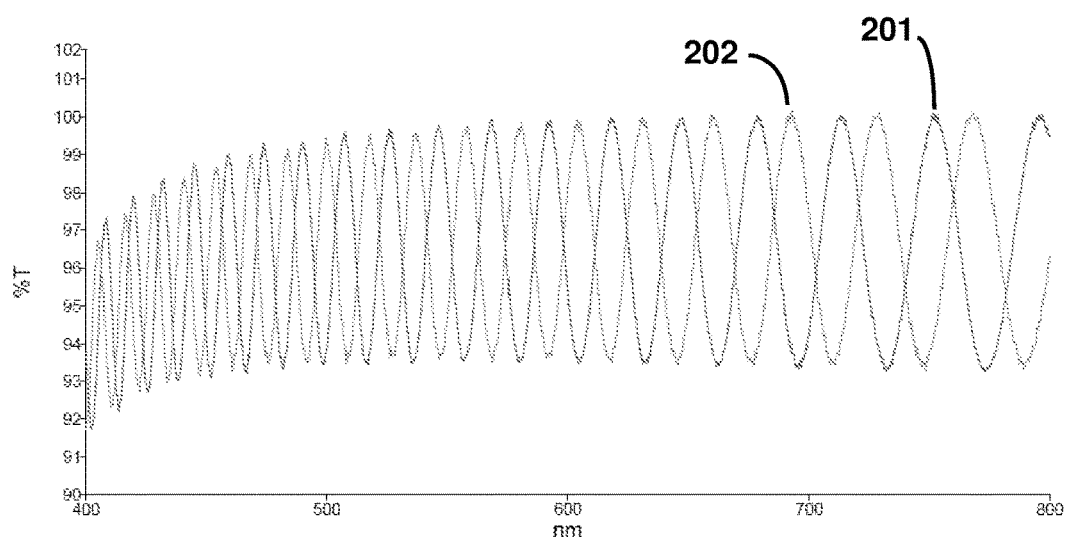
FIG. 4b: UV transmission spectrum of film from formulation ($ZrO_2$-(2-[2-(2-9-methoxyethoxy) ethoxy]acetic acid) in 70:30 BMA-TMPTA) after post bake at (201) 120 C for 3 minute in air, (202) thermal bake at 175 C for 1 hour under $N_2$.
Figure 5A:
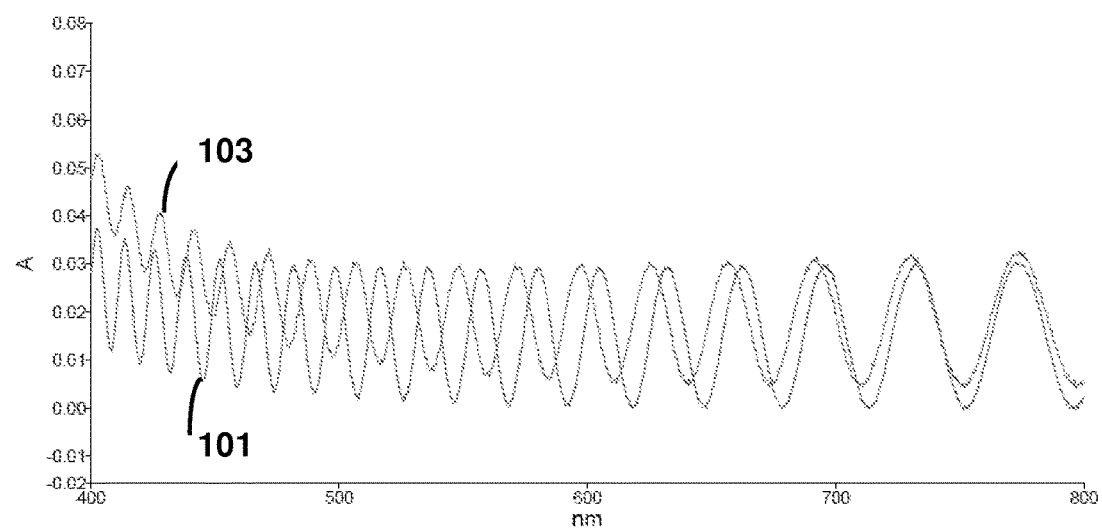
FIG. 5a: UV absorption spectrum of film from formulation ($ZrO_2$-(2-[2-(2-9-methoxyethoxy) ethoxy]acetic acid) in 70:30 BMA-TMPTA) after post bake at (101) 120 C for 3 minute in air, (103) thermal bake at 200 C for 1 hour under $N_2$.
Figure 5B:
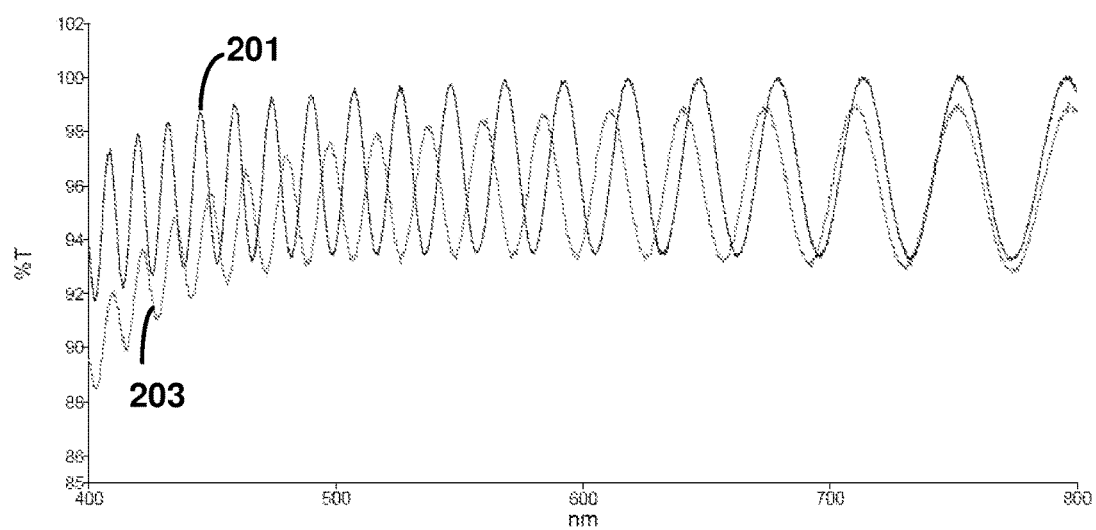
FIG. 5b: UV transmission spectrum of film from formulation ($ZrO_2$-(2-[2-(2-9-methoxyethoxy) ethoxy]acetic acid) in 70:30 BMA-TMPTA) after post bake at (201) 120 C for 3 minute in air, (203) thermal bake at 200 C for 1 hour under $N_2$.
Figure 6A:
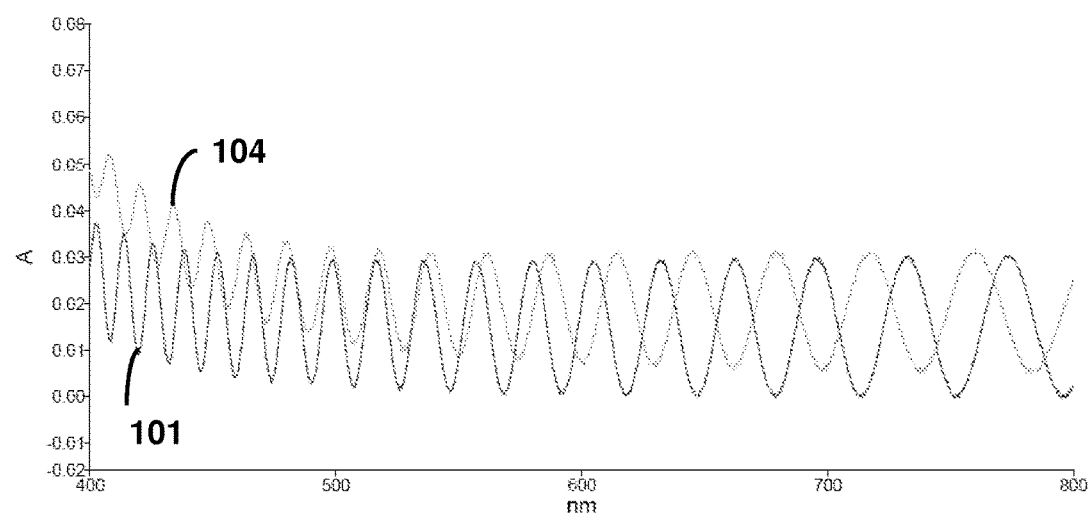
FIG. 6a: UV absorption spectrum of film from formulation ($ZrO_2$-(2-[2-(2-9-methoxyethoxy) ethoxy]acetic acid) in 70:30 BMA-TMPTA) after post bake at (101) 120 C for 3 minute in air, (104) thermal bake at 200 C for 2 hour under $N_2$.
Figure 6B:
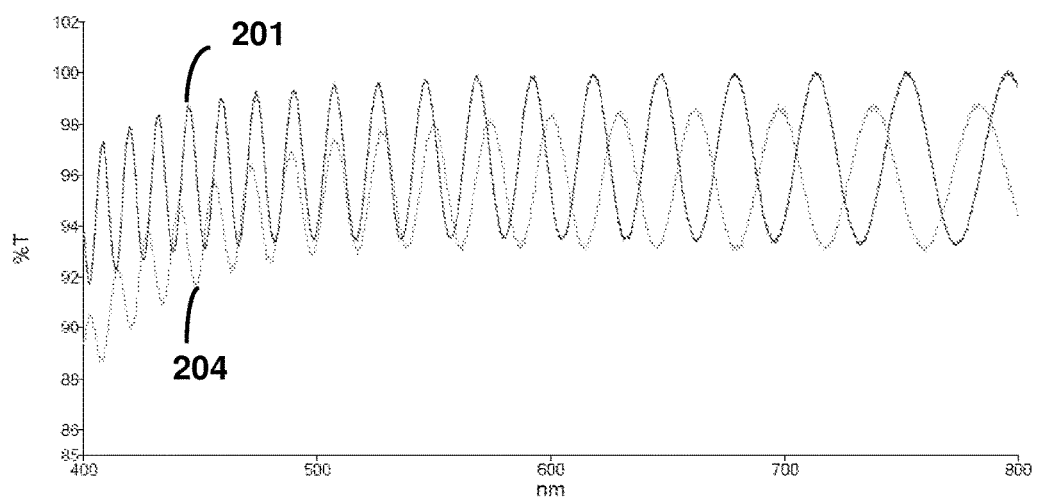
FIG. 6b: UV transmission spectrum of film from formulation ($ZrO_2$-(2-[2-(2-9-methoxyethoxy) ethoxy]acetic acid) in 70:30 BMA-TMPTA) after post bake at (101) 120 C for 3 minute in air, (104) thermal bake at 200 C for 2 hour under $N_2$.

Films of the present disclosure additionally or alternatively possess high optical (440-800 nm) transmittance of 80% or 82%, or 86%, or 88%, or 90%, or 92%, or 94%, or 96%, or 98%, and above for films that are less than 5 microns thick. The films of the present disclosure therefore possess a high optical (440-800 nm) transmittance in the range of 80% to 98% and above for films that are less than 5 microns thick. The transmittance of a film according to the present disclosure may be measured with a Perkin-Elmer UV-Vis Lambda spectrophotometer, wherein the film is coated on a fused silica substrate and another blank fused silica of the same quality and thickness is used as a reference. FIGS. 4, 5 and 6 are examples of the absorbance and transmission results of these films. The ripples shown in these curves are the results of interference of the incoming light and the reflected light at the film/substrate interface.

An exemplary non-limiting embodiment of a coating formulation of the present disclosure comprises or contains a mixture of acrylic monomers and/or oligomers, and capped or surface treated zirconium oxide nanocrystals. The loading or amount of the nanocrystals included in a formulation of the present disclosure is in the range of 50 wt % to 90 wt % based on the weight of the entire formulation, such as a loading of 50 wt % or greater, or 55 wt % or greater, or 60 wt % or greater, or 65 wt % or greater, or 70 wt % or greater, or 75 wt % or greater, or 80 wt % or greater, or 90 wt %.

In addition to the noted nanocrystals, a formulation or material or composition or film or coating of the present disclosure may additionally comprise a curing agent and/or a photo-initiator.

In addition to the noted nanocrystals, a formulation or material or composition of the present disclosure may additionally comprise or contain acrylic monomers, such as benzyl methacrylate (BMA) and trimethylolpropane triacrylate (TMPTA), that optionally included or combined or mixed in a mass ratio in the range of 75:25 to 65:35 wherein the BMA may be present in a relative range of 65-75 and the TMPTA may be present in a relative range of 25-35.

The physical properties of TMPTA, such as viscosity, low volatility and refractive index, make the material uniquely advantageous in a material or composition or film or coating of the present disclosure. TMPTA is less viscous, for example, than hexamethylene diacrylate (HMDA) and bisphenol A diglycerolate dimethacrylate but more viscous than divinylbenzene (DVB). Of the two, TMPTA and HMDA, TMPTA has the higher refractive index (RI=1.474 and 1.456 for TMPTA and HMDA respectively).

BMA is unique in the composition, material and film of the present disclosure in that the monomer has a high refractive index (for an monomer or polymer) of 1.512. The refractive index of BMA therefore helps increase the final refractive index of the film.

Dispersing nanocrystals in BMA alone or with the aid of a solvent such as propylene glycol methyl ether acetate (PGMEA) resulted in films that are difficult to cure by UV or were cracked upon heating at 120 C and above.

Another multifunctional acrylic monomer, such as TMPTA, HMDA, DVB or bisphenol A diglycerate dimethacrylate (Bisphenol A) may be added as a potential additive to increase the viscosity of the formulation. Films from HMDA-BMA, DVB-BMA and Bisphenol A-BMA combinations were found however to be too brittle in formulations containing nanocrystals of the present disclosure such that these films of these combinations cracked when heated at 120 C or above.

Additionally, TMPTA and HMDA have refractive indexes <1.49; such that including these monomers reduces the refractive index of the final formulation and film product when compared with BMA.

As described herein, the specific combinations of BMA, TMPTA and nanocrystals of the present disclosure, in the ratios and amounts described herein, provide unexpected advantages in a combination of physical properties, including but not limited to refractive index, light transmittance, temperature resistance and viscosity.

A mass ratio of BMA to TMPTA in the range of 75:25 to 65:35 as described herein has also been discovered to provide unique and unexpected advantages, i.e. high refractive index, high transmittance, and high temperature resistance, in the formulations or compositions of films of the present disclosure. While materials and/or films containing mass ratios of BMA to TMPTA ranging from 95:5 to 80:20 (i.e., 95:5, 90:10 and 80:20) with nanocrystal loading of 80 wt % and above were stable at temperatures below 120 C, as shown in Table 1. Nanocrystals of the present disclosure dispersed in TMPTA, without BMA, provided a lower refractive index material than with BMA. Films produced from a mass ratio of BMA to TMPTA according to the presently disclosed technology demonstrated enhanced film quality with, for example, reduced surface roughness and thicker films due, at least in part, to higher viscosity.

In addition to the nanocrystals and monomers and/or oligomers and/or polymers of the formulations or compositions or films of the present disclosure, a photo-initiator may be included, such as benzophenone, optionally in an amount of 1-5 wt % based on the total weight of the formulation or composition or material of the present disclosure. Such a photo-initiator may be mixed or included or dissolved or dispersed in the monomer and/or oligomer and/or polymer mix of the presently disclosed formulation by means known in the art, such as by stirring or vortexing at temperature of, for example, in the range of 20-30 C.

While benzophenone has been exemplified herein as a photo initiator, other photo initiators can also or otherwise be employed depending on, for example, curing time and lamp type. Other photo initiators of the present disclosure include Speedcure BEM and TPO (diphenyl(2,4,6-trimethylbenzoyl)-phosphine oxide), which may allow for considerable reduction in the required UV exposure time.

The present disclosure provides a nanocomposite, composition comprising or containing an organic mixture, said mixture comprising acrylate and methacrylate monomers and/or oligomers, capped nanocrystals, wherein said capped nanocrystals are present in the nanocomposite or composition in an amount of greater than 50% by weight of the nanocomposite, composition.

A nanocomposite or composition of the present disclosure optionally has a curing agent and/or photo-initiator.

A nanocomposite or composition of the present disclosure optionally has a photosensitizer, and/or plasticizer, and/or toughener, and/or thickener, and/or thinner, and/or surfactant, and/or flexibilizer, and/or anti-color agent, and/or other functional additives.

A nanocomposite or composition of the present disclosure optionally has a viscosity of less than 12,000 cP at 20 C as measured by a Brookfield RVDV-II+PCP cone and plate viscometer. A nanocomposite and composition of the present disclosure additionally or alternatively has a transmittance higher than 60% at a wavelength of 400 nm as measured by a Perkin Elmer Lambda 850 Spectrophotometer in a 1 cm path length cuvette. A nanocomposite and composition of the present disclosure contains or comprises an organic mixture of benzyl methacrylate and trimethylolpropane triacrylate. Such a nanocomposite, composition of the present disclosure optionally contains or comprises a weight ratio of benzyl methacrylate to TMPTA in the range of 75:25 to 65:35.

The present disclosure provides a coating or film comprising or containing an organic mixture, said mixture comprising acrylate and methacrylate monomer units, capped nanocrystals, wherein said capped nanocrystals are present in the coating or film in an amount of greater than 50% by weight of the coating and film.

A nanocomposite, composition, coating or film of the present disclosure additionally can comprise or contain nanocrystals capped with at least one capping agent selected from 2-[2-(2-9-methoxyethoxy) ethoxy acetic acid, and/or methoxy(triethyleneoxy) propyltrimethoxysilane, and/or 3-methacryloyloxypropyltrimethoxysilane, and/or n-octyl trimethoxysilane, dodecyltrimethoxysilane, and/or m,p-ethylphenethyl trimethoxysilane.

A nanocomposite, composition, coating or film of the present disclosure can additionally comprise or contain nanocrystals comprising or containing at least one of $ZrO_2$, $HfO_2$, $TiO_2$, and ZnO.

A nanocomposite, composition, coating or film of the present disclosure optionally and/or additionally possesses a refractive index of greater than 1.8 at 400 nm.

In some embodiments the nanocomposite, composition, coating or film of the present disclosure does not include the purposeful addition of solvents.

In some embodiments the nanocomposite, composition, coating or film of the present disclosure does not include the purposeful addition of solvents of the mixture comprising acrylate and methacrylate monomers and/or oligomers of the nanocomposite, composition, coating or film.

In some embodiments the nanocomposite, composition, coating or film of the present disclosure does not include purposeful addition of solvents of benzyl methacrylate and trimethylolpropane triacrylate (TMPTA).

In some embodiments the nanocomposite, composition, coating or film of the present disclosure does not include purposeful addition of solvents selected from PGMEA, PGME (Propylene glycol methyl ether), ethanol, THF, and butanol.

The present disclosure further provides a method of making a nanocomposite, composition, coating or film formulation comprising or involving mixing capped nanocrystals with an organic mixture of acrylate and methacrylate monomers and/or oligomers, and at least one curing agent, said nanocrystals being present in an amount of greater than 50% by weight of the nanocomposite, composition, coating or film.

A method of the present disclosure is optionally performed in the absence of solvents.

A method of the present disclosure is optionally performed in the absence of solvents for the mixture comprising acrylate and methacrylate monomers and/or oligomers of the nanocomposite, composition, coating or film.

A method of the present disclosure is optionally performed in the absence for same as above solvents of benzyl methacrylate and trimethylolpropane triacrylate (TMPTA).

A method of the present disclosure comprises or involves mixing an organic mixture comprising or containing benzyl methacrylate and trimethylolpropane triacrylate (TMPTA).

A method of the present disclosure further comprises or involves mixing benzyl methacrylate and TMPTA in weight ratio of benzyl methacrylate to TMPTA in the range of 75:25 to 65:35, such as in a ratio of 70:30.

A method of the present disclosure comprising or involves mixing nanocrystals capped with at least one of 2-[2-(2-9-methoxyethoxy) ethoxy acetic acid, and/or methoxy(triethyleneoxy) propyltrimethoxysilane, and/or 3-methacryloyloxypropyltrimethoxysilane, and/or n-octyl trimethoxysilane, dodecyltrimethoxysilane, and/or m,p-ethylphenethyl trimethoxysilane, with an organic mixture of acrylate and methacrylate monomers and/or oligomers, and at least one curing agent, said nanocrystals being present in an amount of greater than 50% by weight of the nanocomposite, composition, coating or film.

A method of the present disclosure comprises or involves mixing capped nanocrystals, wherein the nanocrystals comprise or contain at least one of $ZrO_2$, $HfO_2$, $TiO_2$, and ZnO.

A method of the present disclosure produces a nanocomposite, composition, coating or film having a refractive index greater than 1.8 at 400 nm.

The present disclosure further provides a coating comprising or containing the nanocomposite, composition, coating or film described herein on at least a portion of a surface of a substrate.

A coating of the present disclosure has a thickness ranging from 100 nm to 1 mm, wherein the transmittance of the coating with 1 µm thickness is higher than 89% at a wavelength of 400 nm, and the percentage haze is less than 2%, preferably less than 1.5%, more preferably less than 1%, and most preferably less than 0.5%.

A coating of the present disclosure optionally and/or additionally has a refractive index greater than 1.8 at 400 nm.

The present disclosure provides a method of producing a coating of the present disclosure comprising or involving applying the nanocomposite, composition, coating or film of the present disclosure to a surface or substrate of the present disclosure by at least one of dip coating, spraying, screen printing, roll-to-roll printing, a draw-bar, spin coating, or slot die coating, and curing said monomers and/or oligomers by activating said curing agent.

A method of curing of the present disclosure comprises or involves activating comprises illumination with radiation in the UV wavelength and/or thermal curing.

A coating of the present disclosure comprises or contains a substrate comprising or containing glass, indium tin oxide (ITO), doped ZnO, GaN, AlN, SiC, Poly(3,4-ethylenedioxythiophene) (PEDOT), polystyrene sulfonate) (PSS) doped PEDOT, Polyethylene terephthalate (PET), Polyethylene naphthalate (PEN), or doped poly(4,4-dioctylcyclopentadithiophene).

The present disclosure further provides an active component comprising or containing an LED, organic LED, touch screen, display, sensor, or a solar cell, said active component, comprising or containing a coating or a film or a layer of the present disclosure.

EXAMPLES

Example 1

In one example of said exemplary non-limiting formulation, acrylic monomers, benzyl methacrylate (BMA) and trimethylolpropane triacrylate (TMPTA), was mixed in a mass ratio of 70-75 to 25-30. 1-5 wt % of benzophenone as photo initiator, was dissolved in the monomer mix either by stirring or vortexing at temperature of 20-30 C. The solution was then filtered to remove dusts and then added to dry ZrO2 nanocrystal and allowed to soak in the monomer blend until no ZrO2 powder was observed. In large scale, gently shaking the dried nanocrystals with the monomer blend is acceptable. Once all ZrO2 nanocrystals powder was completely dispersed in BMA-TMPTA, the viscous suspension was mixed for 10-15 hours. Finally, the viscous suspension was filtered before processing the film.

The suspension was validated by coating films and characterizing the physical properties of the films such as thermal stability and transmittance.

As a standard method, the suspension was coated on a 2" silicon wafer or fused silica wafer to inspect its quality. The wafers were cleaned before applying the film to remove contaminants and dusts. 3-4 micron thick film was spin coated on silicon wafer at 1000-4000 rpm for 1-5 minute.

An optional pre-bake process at 90 C may be performed to remove the residual solvent if that is a concern. In these formulations the solvent is typically less than 10 wt %, more preferably less than 1 wt %. The film was inspected for defects from undispersed particles or air bubbles. If no defects were observed, its surface roughness is measured using a surface profilometer.

The film coated on glass slide or fused silica wafer was cured by UV exposure for 60-200 seconds using a Dymax EC-5000 system with a mercury 'H' bulb and then post-baked for 2-5 minutes at 120-150 C under air. Further, the thermal stability of the film was tested by heating the film at a temperature of 175 C or above, more preferably 200 C, under nitrogen atmosphere for 1-2 hours. A crack free, colorless film is desirable and indicates a good formulation.

These film demonstrate a refractive index of 1.80 or greater at 400 nm and transmittance >89% at 400 nm.

The refractive index is measured with a Woollam M-2000 spectroscopic ellipsometer in the spectral range from 350 nm to 1700 nm and the transmittance was measured using a Perkin Elmer Lambda 850 Spectrophotometer.

This example formulation with 65-75:25-35 mass ratio of BMA to TMPTA with nanocrystal loading of 50 wt % and above produced films that are UV curable and can withstand a thermal baking at 200 C for 1-2 hour under nitrogen, as shown in Table 1.

Example 2

Films spin coated from formulation containing zirconium oxide nanocrystals capped with 2-[2-(2-9-methoxyethoxy) ethoxy]acetic acid at 50-80 wt % loading in the BMA-TMPTA (65-75:25-35 mass ratio) were stable and did not crack when heated at temperatures up to 200 C. However, films from formulation containing zirconium oxide nanocrystals capped with 2-[2-(2-9-methoxyethoxy) ethoxy]acetic acid at 82-85 wt % loading in the BMA-TMPTA (65-75:25-35 mass ratio) were stable only at temperatures below 120 C, as shown in Table 1. Also, zirconium oxide nanocrystals modified with other capping agents such as methoxy (triethyleneoxy) propyltrimethoxysilane and/or 3-methacryloyloxypropyltrimethoxysilane and/or n-octyl trimethoxysilane and/or dodecyltrimethoxysilane and/or m,p-ethylphenethyl trimethoxysilane formed good dispersions in BMA-TMPTA mixture, as well as good films, but was only stable up to 120 C.

One advantage of this exemplary non-limiting embodiment is that both monomers are in liquid form at room temperature so no solvent is necessary at room temperature and the film is UV curable. Surface modified ZrO2 nanocrystals are dispersed directly in the monomer. Such a direct dispersion eliminates, for example, the need to remove the solvent at a later step.

Nanocrystals of the exemplified embodiments of the present disclosure have been surface modified with various capping agents such as 2-[2-(2-9-methoxyethoxy) ethoxy] acetic acid and/or methoxy(triethyleneoxy) propyltrimethoxysilane and/or 3-methacryloyloxypropyltrimethoxysilane and or n-octyl trimethoxysilane and/or dodecyltrimethoxysilane and/or m,p-ethylphenethyl trimethoxysilane. In an exemplified method of producing the capped nanocrystals of the present disclosure, the as-synthesized nanocrystals are allowed to settle for at least 12 hours after synthesis. Since the nanocrystals are surface modified in a solvent other than the synthesis solvent, the nanocrystals are separated from the reaction liquid by decanting off the reaction liquid and rinsing the nanocrystals with the capping solvent. The rinsing solvent is decanted off to obtain a wet cake of uncapped nanocrystals.

For the surface modification of the nanocrystals with 2-[2-(2-9-methoxyethoxy) ethoxy]acetic acid, the nanocrystals are suspended in the capping solvent, for example, toluene for 2-[2-(2-9-methoxyethoxy) ethoxy]acetic acid modification, at a loading of 10 wt % or greater, or 20 wt % or greater, or 30 wt % or greater, calculated based on the weight of the wet nanocrystal cake. While the suspension is stirred, the capping agent is added to it slowly. The amount of capping agent used is in the presently exemplified embodiment 8-60 wt % to the weight of the wet nanocrystal cake. The suspension is allowed to stir at 20-27° C. for 10-30 minutes and then refluxed at the boiling point of the capping solvent for 30-60 minutes. After refluxing, the clear solution is cooled to 50-60° C. slowly. This suspension is then filtered to remove dusts and aggregates bigger than 200 nm sizes.

The capped nanocrystals are then precipitated out from the capping solvent using heptane (2-4 times the mass of the capped solution). The precipitated nanocrystals are collected by centrifugation. The nanocrystal thus collected is dispersed in tetrahydrofuran (THF) and again re-precipitated using heptane. This process is repeated twice. The wet cake of nanocrystals collected in the final step is dried under vacuum for at least 12 hours.

Disclosed Technology

1. A nanocomposite comprising:
   an organic mixture, said mixture comprising acrylate and methacrylate monomers and/or oligomers,
   capped nanocrystals, wherein said capped nanocrystals are present in said nanocomposite in an amount of greater than 50% by weight of the nanocomposite,
   at least one curing agent or photo initiator.
2. The nanocomposite of 1 wherein the viscosity of the nanocomposite is less than 12,000 cP at 20 C as measured by a Brookfield RVDV-II+PCP cone and plate viscometer.
3. The nanocomposite of 1 wherein the transmittance of the formulation is higher than 60% at a wavelength of 400 nm as measured by a Perkin-Elmer UV-Vis Lambda spectrophotometer in a 1 cm path length cuvette.
4. The nanocomposite of 1 wherein the organic mixture comprises a mixture of benzyl methacrylate and trimethylolpropane triacrylate (TMPTA).
5. The nanocomposite of 4 wherein the weight ratio of benzyl methacrylate to TMPTA is 7:3.
6. The nanocomposite of 1 wherein said capped nanocrystals comprise nanocrystals capped with at least one capping agent selected from the group consisting of 2-[2-(2-9-methoxyethoxy) ethoxy acetic acid, 2-[2-(2-9-methoxyethoxy) ethoxy]acetic acid and/or methoxy (triethyleneoxy) propyltrimethoxysilane and/or 3-methacryloyloxypropyltrimethoxysilane and or n-octyl trimethoxysilane and/or dodecyltrimethoxysilane and/or m,p-ethylphenethyl trimethoxysilane.
7. The nanocomposite of 6 wherein said nanocrystals comprise at least one of ZrO2, HfO2, TiO2, and ZnO.
8. The nanocomposite of 1 wherein the refractive index of the nanocomposite is greater than 1.8 at 400 nm.
9. The nanocomposite of 8 wherein the refractive index of the nanocomposite is in the range of 1.6 to 1.9 at 400 nm.
10. The nanocomposite of 1 wherein said nanocomposite does not include solvents.
11. The nanocomposite of 1 wherein said nanocomposite does not include solvents selected from the group consisting of PGMEA, PGME (Propylene glycol methyl ether), ethanol, THF, and butanol.
12. A method of making a nanocomposite formulation comprising:
    mixing capped nanocrystals with an organic mixture of acrylate and methacrylate monomers and/or oligomers, and at least one curing agent, said nanocrystals being present in an amount of greater than 50% by weight of the nanocomposite.
13. The method of 12 wherein said method is performed in the absence of solvents.
14. The method of 12 wherein the viscosity of the nanocomposite is less than 12,000 Cps at 20 C as measure by a Brookfield RVDV-II+PCP cone and plate viscometer.
15. The method of 12 wherein the transmittance of the formulation is higher than 60% at a wavelength of 400 nm as measured by a UV-Vis in a 1 cm path length cuvette.
16. The method of 12 wherein the organic mixture comprises a mixture of benzyl methacrylate and trimethylolpropane triacrylate (TMPTA).
17. The method of 16 wherein the weight ratio of benzyl methacrylate to TMPTA is 7:3.
18. The method of 12 wherein the nanocrystals are capped with at least one of 2-[2-(2-9-methoxyethoxy) ethoxy acetic acid, 2-[2-(2-9-methoxyethoxy) ethoxy]acetic acid and/or methoxy(triethyleneoxy) propyltrimethoxysilane and/or 3-methacryloyloxypropyltrimethoxysilane and or n-octyl trimethoxysilane and/or dodecyltrimethoxysilane and/or m,p-ethylphenethyl trimethoxysilane.
19. The method of 12 wherein said nanocrystals comprise at least one of ZrO2, HfO2, TiO2, and ZnO.
20. The method of 13 wherein the refractive index of the nanocomposite is greater than 1.8 at 400 nm.
21. A coating comprising the nanocomposite of 1 on at least a portion of a surface of a substrate.
22. The coating of 21 having a thickness ranging from 20 nm to 1 mm, wherein the transmittance of the coating with 1 µm thickness is higher than 89% at a wavelength of 400 nm, and the haze is less than 0.5.
23. The coating of 21 wherein the coating has a refractive index greater than 1.8 at 400 nm.
24. The coating of 21 wherein the organic mixture comprises a mixture of poly benzyl methacrylate and poly TMPTA.
25. The coating of 24 wherein the poly benzyl methacrylate and poly TMPTA is formed from a range monomer weight ratio of benzyl methacrylate to TMPTA of 75:25 to 65:35.
26. A coating comprising the nanocomposite of 6 and on at least a portion of a surface of a substrate.
27. A coating comprising the nanocomposite of 7 on at least a portion of a surface of a substrate.
28. A method of making a coating of 21 comprising applying the nanocomposite to the surface by at least one of dip coating, spraying, screen printing, roll-to-toll printing, a draw-bar, spin coating, or slot die coating, and curing said monomers and/or oligomers by activating said curing agent.
29. The method of 28 wherein said activating comprises illumination with radiation in the UV wavelength.
30. The method of 28 wherein said curing further comprises thermal curing.
31. The method of 28 wherein the coating, after curing, has a thickness ranging from 20 nm to 1 mm, wherein the transmittance of the coating with 1 µm thickness is higher than 89% at a wavelength of 400 nm, and the haze is less than 0.5.
32. A method of making a coating of 24 comprising applying the nanocomposite to the surface by at least one of dip coating, spraying, screen printing, roll-to-toll printing, a draw-bar, spin coating, or slot die coating, and curing said monomers and/or oligomers by activating said curing agent.
33. A method of making a coating of 25 comprising applying the nanocomposite to the surface by at least one of dip coating, spraying, screen printing, roll-to-toll printing, a draw-bar, spin coating, or slot die coating, and curing said monomers and/or oligomers by activating said curing agent.
34. A method of making a coating of 26 comprising applying the nanocomposite to the surface by at least one of dip coating, spraying, screen printing, roll-to-toll printing, a draw-bar, spin coating, or slot die coating, and curing said monomers and/or oligomers by activating said curing agent.
35. A method of making a coating of 27 comprising applying the nanocomposite to the surface by at least one of dip coating, spraying, screen printing, roll-to-toll printing, a draw-bar, spin coating, or slot die coating, and curing said monomers and/or oligomers by activating said curing agent.
36. The coating of 21 wherein the substrate comprises glass, indium tin oxide (ITO), doped ZnO, GaN, AlN, SiC, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene).
37. The coating of 22 wherein the substrate comprises glass, indium tin oxide (ITO), doped ZnO, GaN, AlN, SiC, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene).
38. The coating of 23 wherein the substrate comprises glass, indium tin oxide (ITO), doped ZnO, GaN, AlN, SiC, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene).
39. The coating of 24 wherein the substrate comprises glass, indium tin oxide (ITO), doped ZnO, GaN, AlN, SiC, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene).
40. The coating of 25 wherein the substrate comprises glass, indium tin oxide (ITO), doped ZnO, GaN, AlN, SiC, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene).
41. The coating of 26 wherein the substrate comprises glass, indium tin oxide (ITO), doped ZnO, GaN, AlN, SiC, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene).
42. The coating of 27 wherein the substrate comprises glass, indium tin oxide (ITO), doped ZnO, GaN, AlN, SiC, Poly(3,4-ethylenedioxythiophene) (PEDOT), poly(styrene sulfonate) (PSS) doped PEDOT, Polyethylene terephthalate (PET), Polyethylene naphthalate (PEN), or doped poly(4,4-dioctylcyclopentadithiophene).
43. An active component comprises an LED, organic LED, touch screen, display, sensor, or a solar cell, said active component comprising a coating of 21.
44. An active component comprises an LED, organic LED, touch screen, display, sensor, or a solar cell, said active component comprising a coating of 22.
45. An active component comprises an LED, organic LED, touch screen, display, sensor, or a solar cell, said active component comprising a coating of 23.
46. An active component comprises an LED, organic LED, touch screen, display, sensor, or a solar cell, said active component comprising a coating of 24.
47. An active component comprises an LED, organic LED, touch screen, display, sensor, or a solar cell, said active component comprising a coating of 25.
48. An active component comprises an LED, organic LED, touch screen, display, sensor, or a solar cell, said active component comprising a coating of 26.
49. An active component comprises an LED, organic LED, touch screen, display, sensor, or a solar cell, said active component comprising a coating of 27.
50. A nanocomposite comprising:
an organic mixture, said mixture comprising acrylate and methacrylate monomers and/or oligomers,
capped nanocrystals, wherein said capped nanocrystals are present in said nanocomposite in an amount of greater than 50% by weight of the nanocomposite.

The current disclosure relates to a nanocomposites coating including metal oxide nanocrystals, the nanocomposites further include a mixture of acrylates monomers and oligomers to provide a curable coating that provides high refractive index, high transmittance, and high temperature stability.

TABLE 1

Film results of capped ZrO2 nanocrystals in monomer mixture. 'Good' indicates that the film does not yellow or crack when heated at those indicated temperatures. 'Cracked' indicates that the film cracked during thermal baking. Disadvantage of this formulation is that it comprises of PGMEA to aid in the solubility.

| Monomer mix | Content of $ZrO_2$ to monomer | Capping agent | Post baked at 120 C./ 60/air | Post baked at 175 C./ 60/$N_2$ | Post baked at 200 C./N2/ 60 min |
|---|---|---|---|---|---|
| 2-10 wt % Bisphenol A diglycerolate dimethacrylate in BMA | 50-80 wt % | 2-[2-(2-9-methoxyethoxy)ethoxy]acetic acid | good | cracked | |
| 2-25 wt % TMPTA in BMA | 50-80 wt % | methoxy(triethyleneoxy)propyltrimethoxysilane and 3-methacryloyloxypropyl trimethoxysilane | good | cracked | |
| 25-30 wt % TMPTA in BMA | 50-80 wt % | methoxy(triethyleneoxy)propyltrimethoxysilane and 3-methacryloyloxypropyl trimethoxysilane | good | good | cracked |

TABLE 1-continued

Film results of capped ZrO2 nanocrystals in monomer mixture. 'Good'
indicates that the film does not yellow or crack when heated at those indicated
temperatures. 'Cracked' indicates that the film cracked during thermal baking.
Disadvantage of this formulation is that it comprises of PGMEA to aid in the solubility.

| Monomer mix | Content of $ZrO_2$ to monomer | Capping agent | Post baked at 120 C./ 60/air | Post baked at 175 C./ 60/$N_2$ | Post baked at 200 C./N2/ 60 min |
|---|---|---|---|---|---|
| 20-30 wt % TMPTA in BMA | 50-80 wt % | 2-[2-(2-9-methoxyethoxy)ethoxy]acetic acid | good | good | good |
| 25-30 wt % TMPTA in BMA | 50-80 wt % | methoxy(triethyleneoxy)propyltrimethoxysilane | good | cracked | cracked |
| 25-30 wt % TMPTA in BMA | 82-86 wt % | 2-[2-(2-9-methoxyethoxy)ethoxy]acetic acid | good | cracked | cracked |

TECHNICAL FIELD

Preparation of capped colloidal semiconductor nanocrystals and their dispersions in polymeric solutions and films are described herein. The colloidal semiconductor nanocrystals are highly monodisperse with nanocrystal size between 1-1 O nm. Nanocomposites having a high loading density of uniformly dispersed capped semiconductor nanocrystals incorporated therein may be formed with these nanocrystals. Suspensions of nanocrystals may be formed in various solvents and nanocomposites made of same may be made optically transparent with very little or no scattering.

Nanocrystals are single crystals of a material in which at least one dimension of the crystal is less than 1 micron in size. Nanocrystals may either retain the optical, mechanical, and physical properties of their bulk counterparts or display properties which are quite different. Nanocrystals can be made by a wide variety of methods, some of which include: liquid synthesis, solvothermal synthesis, vapor phase synthesis, aerosol synthesis, pyrolysis, flame pyrolysis, laser pyrolysis, ball-milling, and laser ablation.

Nanocrystals can be dispersed into a variety of media or combination of media, including, but not limited to: liquids, gels, glasses, polymers and solids.

The dispersed nanocrystals may impart all or some of the properties of the nanocrystals upon the dispersion or may give the dispersion properties which are different from any of the individual components. The quality of the dispersion created between the nanocrystals and the media can have a large effect on the properties of the final dispersion. The quality of the dispersion of the nanocrystals in a medium can be described as being governed by complex interactions between a set of parameters, which include, but are not limited to: the chemistry of the nanocrystal surface (or the effective nanocrystal surface), the size and shape of the nanocrystals, the physical properties of the nanocrystals, the chemistry of the dispersion media, and the physical properties of the dispersion media. Well-dispersed nanocrystals can be defined as nanocrystals which are uniformly distributed throughout the media with a minimal amount of nanocrystal aggregates present. If the nanocrystals are not well-dispersed in the medium, the optical, mechanical, and physical properties of the nanocrystals may be altered or the properties of the media may be adversely affected.

Nanocomposites are nanocrystal dispersions composed of nanocrystals dispersed in a matrix including: polymers, ceramics and glasses. Nanocomposites can be made by the mixing of nanocrystals, either in powder form or already dispersed in another media, with precursor components of the matrix. A non-exhaustive list of potential matrix components for use in the formation of nanocomposites includes: monomers, oligomers, polymers, pre-polymeric resins, ceramics, pre-ceramics and glasses. Nanocomposites can be considered to be an extension of the well-known field of composites, where the micron-sized, or larger, fillers used in composites have been replaced by nanocrystals, In both composites and nanocomposites it may be possible to modify the optical, mechanical, and physical properties of the nanocomposites with the filler materials, but the reduced size of the fillers used in nanocomposites may result in relatively fewer, or less intense, detrimental effects due to the inclusion of a filler into the matrix. A list of these potentially detrimental effects which may happen to the composite include: reduced structural integrity, reduced mechanical strength, reduced mechanical stability, reduced flexibility, reduced optical transparency, and reduced thermal stability. To more fully realize the potential of using nanocrystals as replacements for micron size, or larger, fillers, the nanocrystals need to be able to be well-dispersed in the matrix. This is due to the fact that aggregated nanocrystals in the composite act as detrimentally as, or worse than, fillers of the size of the aggregates. Thus a composite made of heavily aggregated 5 nm particles, where the size of the aggregates are greater than 1 micron in all dimensions may not behave as a nanocomposite.

Typical routes for the manufacture of nanocomposites often result in a distribution of nanocrystals in the media that cannot be described as well-dispersed. The distribution of the nanocrystals is often non-uniform and contains large amounts of aggregates. One key to producing well-dispersed nanocomposites is to use nanocrystals which are not aggregated before the start of mixing with the matrix or media.

There are two main types of aggregates that are often discussed in literature. Hard aggregates are clusters of nanocrystals, in which the nanocrystars are relatively strongly bound to each other. Hard aggregates may be the result of particles that have come into contact during formation or after formation but while the materials are still at elevated temperatures. The other type of aggregates, soft aggregates, is usually formed after synthesis, or at lower temperatures. The conventional wisdom is that soft aggregates can be broken apart easily during processing and can thus be made to be well-dispersed, whereas hard aggregates cannot be broken apart without great difficulty and therefore are not suitable sources of well-dispersed nanocrystals. In order to form dispersions in which the nanocrystals are well dispersed, it is preferable to avoid both types of aggregation.

Nanocrystal aggregation is controlled by the surface chemistry (or chemistry of the effective surface) of the nanocrystals. In a dispersion, the inter-particle forces (such as electrostatic forces, van der Waals forces and entropic forces) between the surfaces of the nanocrystals result in a tendency to form aggregates. These inter-particle forces are particularly important in nanocrystals because of the large surface to volume ratio for these particles. In order to avoid aggregation in dispersion it is desirable for the surfaces of the nanocrystals to be passivated (or stabilized). One method that may be used to passivate the surface of the nanocrystal involves the introduction of ligand ions or molecules. These ligands, which are also called capping agents or caps, are added to the surface of the nanocrystals and thus create a new effective surface of the nanocrystals. This effective surface is the surface of the shell created by the complete or partial surface coverage with ligands. The chemistry of this effective surface can be tailored in order to create a chemical environment, distinct from the actual or initial surface of the nanocrystal, which facilitates dispersion while preventing or reducing aggregation. These passivating ligands can help prevent aggregation in a variety of ways. Electrostatic passivation, utilizing like charges to repulse the nanocrystals, and steric passivation, using bulky molecules to physically keep the nanocrystal surfaces apart, are two examples of surface passivation methods.

Most typical nanocrystal synthetic methods, such as aerosol synthesis, pyrolysis, flame pyrolysis, laser pyrolysis, ball-milling, and laser ablation, produce nanocrystals which have no surface passivation of the types described herein. In fact, many of these methods produce nanocrystals that are clustered together as hard aggregates. Even if the synthesis does not result in aggregated nanocrystals, metal oxide nanocrystals without surface passivation tend toward aggregation because of inter-particle forces.

The liquid synthesis of metal oxide colloidal nanocrystals is a method of producing nanocrystals which are, at least partially, surface passivated during the synthesis. The liquid synthesis is performed in solvent with or without the presence of capping agents. The nanocrystals are protected against aggregation, at least partially, during the synthesis and afterwards, by capping agents. In cases where the synthesis is carried out in a coordinating solvent, the solvent molecules, or products thereof, may act as the capping agent to passivate the surface. After liquid synthesis, the nanocrystals are protected from forming aggregates by partial or total coverage of the nanocrystals with solvent(s), product(s) of the solvent(s), added capping agent(s), and/or combination thereof.

After synthesis of nanocrystals by liquid synthesis, the as-made surface passivation can be modified by a process known as a cap exchange or ligand exchange reaction in which one ligand or capping agent is at least partially replaced by a different one. In this process the nanocrystals are usually dispersed in a solvent along with the desired capping agent. In some instances the temperature of the suspension may be elevated to further drive the exchange process. As a result of the cap exchange, either the new capping agent is added to some fraction of the nanocrystal surface or a fraction of the previous surface passivation agents are replaced by the new capping agent, or some combination thereof. The new capping agent may be chosen in order to yield chemical compatibility between the effective nanocrystal surface and the solvent, or other media, chosen for the final dispersion or application.

As-synthesized nanocrystals, which have been produced by other methods and do not have surface passivation, can also be exposed to capping agents. While this also may result in some fraction of the surface of the nanocrystals being covered by the capping agents, this process may not be able to break apart any aggregates which will have formed previously, including both hard and soft aggregates. These aggregates of oxide nanocrystals are distinct from very weakly bound agglomerates of surface passivated nanocrystals where the passivation agents may create a porous spacer between the nanocrystals. In the weakly bound agglomerates, the inter-nanocrystal spacer layers provided by surface passivation are important because many of the surface to surface forces which cause aggregation are short range interactions, which can be reduced by the increased nanocrystal separation. However, in the absence of surface passivation, once the nanocrystal surfaces have been brought together, such as in the formation of hard aggregates, the short range forces dominate and it is difficult to separate the nanocrystals again.

Agglomerates of surface passivated nanocrystals, which can be broken up, may form during various points in the production of a dispersion, including during the washing of the particles, and the drying of powders. One of the advantages of using liquid synthesis to produce colloidal nanocrystals is that surface passivation of the as-synthesized nanocrystals can be used to prevent or reduce both hard and soft aggregates from forming during all stages of nanocrystal processing from the synthesis, to post-synthetic processing, to formation of the final high quality dispersion.

In order to achieve higher quality nanocomposites, nanocrystal particle size should advantageously be less than 10 nm in at least one dimension, with preferably a very narrow particle size distribution, and further with specific particle shape (rod, spherical, etc). In addition, the surface chemistry of the nanocrystal is advantageously well passivated, preventing or reducing aggregation, and increasing or enhancing compatibility with the solvent(s) and/or the matrix material, and thereby allowing or enhancing dispersion of the nanocrystals into a nanocomposite or other substrate containing same.

Nanocrystals of the present disclosure will also be recognized in the art as including, for example, nanoparticles, quantum dots and colloidal particles and can include particles that are crystalline and/or amorphous with sizes ranging from a few hundred nanometers down to 1 nm or less. Due to their small size, nanocrystals can possess dramatically different physical properties compared to bulk forms of similar materials, due, for example, to the quantum effect and/or a greater area/volume ratio. Nanocrystals of the present disclosure may be useful in, for example, applications ranging from metallurgy to chemical sensors, and industries ranging from pharmaceuticals to paints and coatings to cosmetics.

Colloidal semiconductor nanocrystals are chemically synthesized, on the nanometer scale with ligands or capping agents on the surface of the nanocrystals to afford both dispersibility and stability in solution. In a basic chemical synthetic route, the precursors of the semiconductor nanocrystals react or decompose in the presence of a stabilizing organic capping agent or a solvent. Varying the size of the nanocrystals can be achieved by changing the reaction time or temperature profile, or adjusting the sequence of precursor addition, or varying the concentrations of chemical precursors, or varying the ratios of concentrations of chemical precursors, and/or varying the capping agents.

The chemistry of the capping agent effects and/or controls several of the system parameters in the manufacture of the nanocrystals and/or the nanocomposites, such as the growth rate, shape, and dispersibility of the nanocrystals in a variety of solvents and solids, and even the excited state lifetimes of charge carriers in the nanocrystals. The flexibility of the resulting effects of this chemical synthesis is demonstrated by the fact that often one capping agent is chosen for its growth control properties and is later substituted out, either partially or fully, after synthesis for a different capping agent. This substitution may be carried out for a variety of reasons, including, but not limited to: in order to provide a nanocrystal/media interface more suitable to the given application or to modify the optical properties of the nanocrystal.

Synthetic methods for producing colloidal semiconductor nanocrystals of zinc oxide (ZnO), yttrium oxide ($Y_2O_3$), hafnium oxide ($HfO_2$), and zirconium oxide ($ZrO_2$), hafnium-zirconium oxide [$HfO_2:ZrO_2$] and titanium-zirconium oxide [$TiO2:ZrO_2$], as well as capping and cap-exchange of these nanocrystals and dispersion of these materials in solvents and polymers and the creation of nanocomposites are described herein.

Functionalized organosilanes are a common class of organic compounds used to populate the surface of a nanocrystalline oxide material as capping agents. These organosilanes are typically composed of head and tail components. The head of a functionalized organosilane is typically either a trialkoxysilane group or a trichlorosilane group, although bi- and mono-substituted alkoxy and chloro silane are possible. The head anchors to the surface of the oxide through a covalent bond with the hydroxide groups (—OH) or —OR group wherein R is an alkyl or aryl group, present at the surface, eliminating an alcohol, alkyl chloride, water or HCl as a by-product. The tails of a functionalized organosilane can include one or more of an alkyl chains of varying lengths, aryl groups, or ether groups, amines, thiols, or carboxylic acid.

Figure 7:
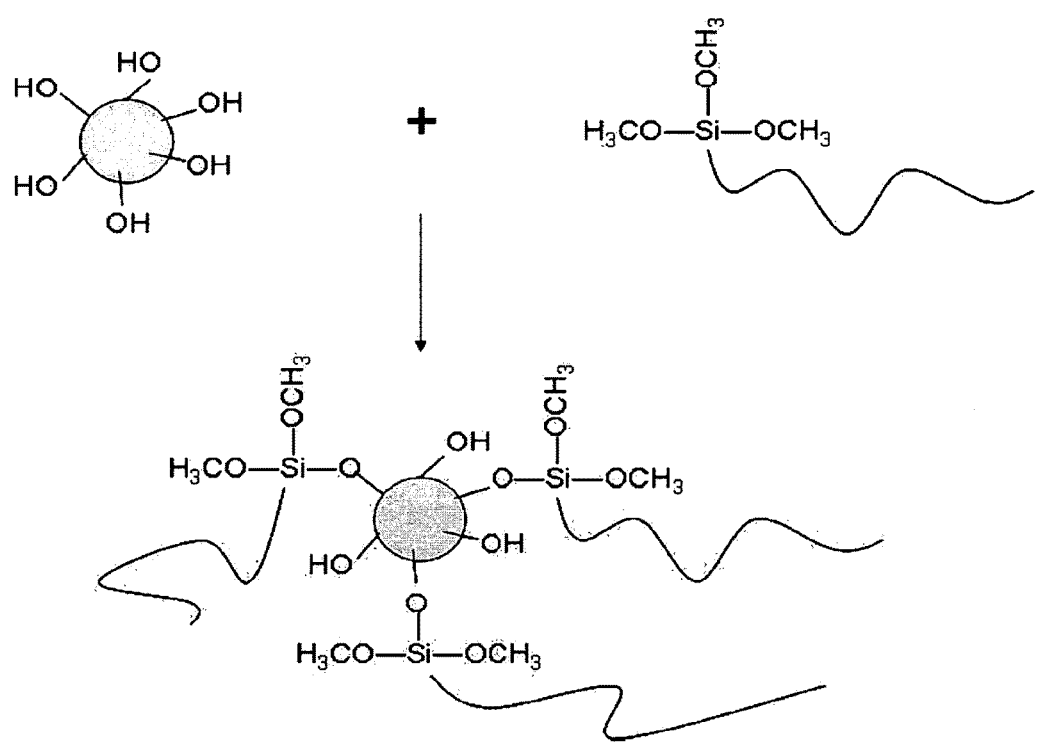
FIG. 7 illustrates the attachment of an organosilane to a nanocrystal surface through alcohol elimination

FIG. 7 shows an exemplary attachment of an organosilane to a nanocrystal surface through an alcohol elimination reaction. In this reaction, the nanocrystals with a polar surface containing —OH groups react with an organosilane to form the organosilane capped nanocrystals (103).

Other classes of organic compounds used as capping agents to passivate the surface of an oxide material include organocarboxylic acids and organoalcohols. The head of organocarboxylic acids is a carboxylic acid (—COOH) group and organoalcohols is an —OH group. The head anchors to the surface of the oxide through a covalent bond with the hydroxide groups (—OH) or —OR (R=alkyl or aryl) group present at the surface, eliminating an alcohol, or water as a by-product. The tails of a functionalized organocarboxylic acids and organoalcohols can be composed of alkyl chains of a variety of lengths, aryl groups, ether groups, amines, thiols, or carboxylic acids.

The use of a capping agent such as functionalized organosilanes, alcohols or carboxylic acids on colloidal nanocrystals impart a number of desired characteristics, such as for example, controlling their compatibility to various dispersing solvents, such as polar or non-polar media, which can thereby reduce nanocrystal aggregation.

The present disclosure further includes methods for the surface modification of nanocrystals with organosilanes, organoalcohols and/or organocarboxylic acids. The method includes depositing capping agents during the synthesis of the nanocrystals or through ligand exchange of at least part of the capping agent originally present on the nanocrystal with a second one after the synthesis. These reactions can be performed under ambient, heated, and/or high temperature/high pressure conditions.

The present disclosure further includes a nanocomposite material containing a matrix and nanocrystals, which have been, for example, mixed, stirred, or dispersed therein. Nanocomposites according to the present disclosure may be fabricated by, for example, melt blending, in situ polymerization, and/or solvent mixing of the nanocrystals and the matrix materials or precursors of the matrix.

In melt blending, nanocrystals are mixed with a polymer in its molten state with the assistance of mechanical forces. In situ polymerization involves mixing nanocrystals with monomer(s) which are then polymerized to form a composite. Solvent mixing involves the use of solvent(s) to disperse both the nanocrystals and the polymer whereby uniform dispersion of the polymer and nanocrystals is achieved by removal of the solvent.

The present disclosure includes preparation methods for nanocomposite materials which include solvent mixing of polymers, or polymer precursors, with nanocrystals capped with a functionalized organosilanes, organoacids or organoalcohols; and in situ polymerization of capped nanocystals and monomers of polymers.

DESCRIPTION

The synthetic methods to prepare high quality semiconductor metal oxide nanocrystals described herein include synthetic methods wherein a precursor of the metal oxide is mixed or dissolved in at least one solvent and allowed to react for a certain period of time. The use of pressure or heating may be necessary in some cases.

At least in the case of $ZrO_2$ and $HfO_2$ nanocrystal syntheses, addition of water into the solvent surprisingly results in smaller particles than reactions carried out without addition of water, as described in the examples. By controlling the amount of water added to the solvent the average particle size of the nanocrystals can be controlled.

The precursors of the metal oxides may be one or more of alkoxides, such as: zirconium ethoxide ($Zr(OCH_2CH_3)_4$), zirconium n-propoxide ($Zr(OCH_2CH_2CH_3)_4$), zirconium isopropoxide ($Zr(OCH(CH_3)_2)_4$), zirconium n-butoxide ($Zr(OCH_2CH_2CH_2CH_3)_4$), zirconium t-butoxide ($Zr(OC(CH_3)_3)_4$), hafnium ethoxide ($Hf(OCH_2CH_3)_4$), hafnium n-propoxide ($Hf(OCH_2CH_2CH_3)_4$), hafnium isopropoxide ($Hf(OCH(CH_3)_2)_4$), hafnium butoxide ($Hf(OCH_2CH_2CH_2CH_3)_4$), hafnium t-butoxide ($Hf(OC(CH_3)_3)_4$), titanium ethoxide ($Ti(OCH_2CH_3)_4$), titanium n-propoxide ($Ti(OCH_2CH_2CH_3)_4$), titanium isopropoxide ($Ti(OCH(CH_3)_2)_4$), titanium t-butoxide ($Zr(OC(CH_3)_3)_4$), titanium n-butoxide ($Ti(OCH_2CH_2CH_2CH_3)_4$), zinc ethoxide ($Zn(OCH_2CH_3)_2$), zinc n-propoxide ($Zn(OCH_2CH_2CH_3)_2$), zinc isopropoxide ($Zr(OCH(CH_3)_2)_2$), zinc butoxide ($Zn(OCH_2CH_2CH_2CH_3)_2$); acetates or acetylacetonates, such as, zirconium acetate ($Zr(OOCCH_3)_4$), zirconium acetylacetonate ($Zr(CH_3COCHCOCH_3)_4$), zinc acetate ($Zn(OOCCH_3)_2$), zinc acetylacetonate ($Zn(CH_3COCHCOCH_3)_2$), hafnium acetate ($Hf(OOCCH_3)_4$); halides such as zirconium chloride ($ZrCl_4$), zirconium fluoride ($ZrF_4$), zirconium iodide ($ZrI_4$), zirconium bromide ($ZrBr_4$), hafnium bromide ($HfBr_4$), hafnium chloride ($HfCl_4$), hafnium iodide ($HfI_4$), titanium chloride ($TiCl_4$), titanium bromide ($TiBr_4$), titanium iodide ($TiI_4$), titanium fluoride ($TiF_4$), zinc chloride ($ZnCl_2$), zinc bromide ($ZnBr_2$), zinc iodide ($ZnI_2$), zinc fluoride ($ZnF_2$) or other organometallic compounds.

Solvents useful in the present disclosure include benzyl alcohol, phenol, oleyl alcohol, toluene, butanol, propanol, isopropanol, ethanol, water, propylene glycol monomethyl ether (PGME), propylene glycol methyl ether acetate (PGMEA), ethyl lactate (EL), and 2-propoxy-propanol (PnP), acetone, tetrahydrofuran, cyclic ketones and mixtures thereof.

The surface of nanocrystals of the present disclosure are optionally capped with at least one capping agent such as organosilane, organoalcohol or organocarboxylic acid. Examples of organosilanes of the present disclosure include, n-propyltrimethoxysilane, n-propyltriethoxysilane, n-octyltrimethoxysilane, n-octyltriethoxysilane, phenytrimethoxysilane, 2-[methoxy(polyethyleneoxy)propyl]-trimethoxysilane, methoxy(triethyleneoxy)propyltrimethoxysilane, 3-aminopropyltrimethoxysilane, 3-mercaptopropyltrimethoxysilane, 3-(methacryloyloxy)propyl trimethoxysilane, 3-isocyanatopropyltriethoxysilane, 3-isocyanatopropyltrimethoxysilane, and glycidoxypropyltrimethoxysilane.

Examples of organoalcohols of the present disclosure include, heptanol, hexanol, octanol, benzyl alcohol, phenol, ethanol, propanol, butanol, oleylalcohol, dodecylalcohol, octadecanol and triethylene glycol monomethyl ether.

Examples of organocarboxylic acids of the present disclosure include, octanoic acid, acetic acid, propionic acid, 2-[2-(2-methoxyethoxy)ethoxy] acetic acid, oleic acid, benzoic acid.

Capped colloidal semiconductor nanocrystals of the present disclosure are, optionally, removed from and re-dispersed into solvents, such as, water, tetrahydrofuran, ethanol, methanol, acetonitrile, PGMEA, PGPE, PGME, cyclic ketones, ethyl lactate, acetone, naphtha, hexane, heptane, toluene or a mixture thereof.

Semiconductor nanocrystals can be added into a matrix to form a nanocomposite. The matrix material of the present disclosure include, polyacrylonitrile-butadiene-styrene) (ABS), poly(methyl methacrylate) (PMMA), celluloid, cellulose acetate, poly(ethylene-vinyl acetate) (EVA), poly(ethylene vinyl alcohol) (EVOH), fluoroplastics, polyacrylates (Acrylic), polyacrylonitrile (PAN), polyamide (PA or Nylon), polyamideimide (PAI), polyaryletherketone (PAEK), polybutadiene (PBD), polybutylene (PB), polybutylene terephthalate (PBT), polycaprolactone (PCL), polychlorotrifluoroethylene (PCTFE), polyethylene terephthalate (PET), polycyclohexylene dimethylene terephthalate (PCT), polycarbonate (PC), polyhydroxyalkanoates (PHAs), polyketone (PK), polyester, polyethylene (PE), polyetheretherketone (PEEK), polyetherketoneketone (PEKK), polyetherimide (PEI), polyethersulfone (PES), polyethylenechlorinates (PEC), polyimide (PI), polylactic acid (PLA), polymethylpentene (PMP), polyphenylene oxide (PPO), polyphenylene sulfide (PPS), polyphthalamide (PPA), polypropylene (PP), polystyrene (PS), polysulfone (PSU), polytrimethylene terephthalate (PTT), polyurethane (PU), polyvinyl acetate (PVA), polyvinyl chloride (PVC), polyvinylidene chloride (PVDC), polystyrene-acrylonitrile) (SAN); a spin-on-glass (SOG) polymer, such as: Siloxane-spin-on polymers in Ethanol, Propylene Glycol Methyl Ether Acetate (PGMEA), isopropyl alcohol or mixture of these solvents, JSR Micro topcoat (NFC TCX 014 in 4-methyl-2-pentanol), JSR Micro photoresist (ARF 1682J-19), and silicones, such as: Polydimethylsiloxane (PDMS) and polymethylphenylsiloxane.

Examples of nanocrystals include, but are not limited to, CuCl, CuBr, CuI, AgCl, AgBr, AgI, $Ag_2S$, $Ag_2Te$, $Al_2O_3$, $Ga_2O_3$, $In_2O_3$, FeO, $Fe_2O_3$, $Fe_3O_4$, $TiO_2$, MgO, $Eu_2O_3$, $CrO_2$, CaO, MgO, ZnO, $Mg_xZn_{1-x}$, $SiO_2$, $Cu_2O$, $Zr_2O_3$, $ZrO_2$, $SnO_2$, ZnS, HgS, $Fe_2S$, $Cu_2S$, $CuIn_2S_2$, $MoS_2$, $In_2S_3$, $Bi_2S_3$, GaP, GaAs, GaSb, InP, InAs, $In_xGa_{1-x}As$, SiC, $Si_{1-x}Ge_x$, $CaF_2$, $YF_3$, $YSi_2$, $GaInP_2$, $Cd_3P_2$, $CuIn_2Se_2$, $In_2Se_3$, $HgI_2$, $PbI_2$, ZnSe, CdS, CdSe, CdTe, HgTe, CdHgTe, PbS, BN, AlN, GaN, InN, $Al_xGa_{1-x}N$, $Si_3N_4$, ZrN, $Y_2O_3$, $HfO_2$, $Sc_2O_3$, and their mixtures or alloys, wherein x may have a value of between 0.01 to 0.99.

The present disclosure provides a method of making nanocrystals including dissolving precursors of said nanocrystals in at least one solvent to produce a solution, optionally at least one of heating and increasing pressure of said solution, and reacting the precursors or the precursors and the at least one solvent of the solution to form the nanocrystals.

The nanocrystals may be capped with at least one agent to increase the solubility or dispersibility of the nanocrystals in at least one solvent or other media, or some combination of solvent and other media.

In the method of the disclosure, nanocrystals may be capped with at least one agent which may include at least one organosilane, organoalcohol or organocarboxylic acid. These capping agents may impart uniform dispersion of the nanocrystals in different media such as hydrophobic or hydrophilic media by creating an effective nanocrystal surface which is formed by the full or partial shell of capping agents whose tail groups have a polarity compatible with the media.

The capping method of the present disclosure may including capping of the nanocrystals with the at least one capping agent in the solution, prior to, during, or after said reacting the precursors. The methods of the present disclosure further include purifying and/or separating the nanocrystals prior to, or after, the capping method of the present disclosure.

Figure 8:
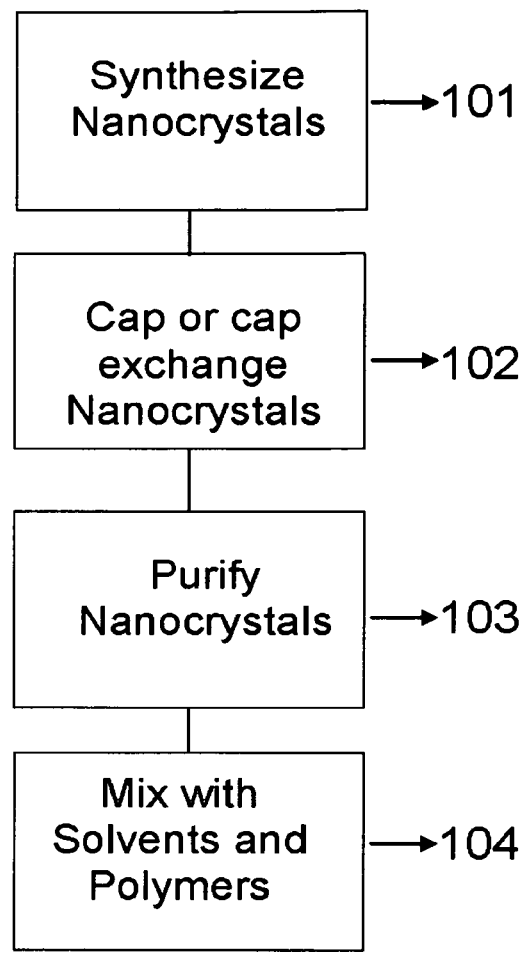
FIG. 8 shows, in a block diagram, process steps of the present disclosure for the formation of a nanocomposite material described herein.

The method of the disclosure includes capping the as-synthesized, purified, and/or separated nanocrystals with at least one capping agent to produce at least partially capped nanocrystals. The at least partially purified capped nanocrystals may be further purified and/or separated according to methods of the present disclosure. Nanocrystals and capped nanocrystals may be dispersed in a material, including solvent, polymer, or some combination thereof in methods of the present disclosure. FIG. 8 is a block diagram exemplifying formation of a colloidal suspension. In the exemplified method, nanocrystals are synthesized (101), capped or cap exchanged with at least one capping agent (102), purified (103) and mixed with solvents or polymer solutions (104).

The present disclosure further includes methods of exchanging, fully or partially, the pre-existing organic moieties or other capping agents present on the nanocrystal surface resulting from the synthesis of the nanocrystals or other previous cap exchange reactions with functionalized organosilanes, organoalcohols and organocarboxylic acids in a cap exchange reaction.

Functionalized capping agents are covalently bonded to colloidal semiconductor nanocrystals according to an aspect of the present disclosure during synthesis of the colloidal semiconductor nanocrystal.

Functionalized capping agents are optionally covalently bonded to semiconductors in the present disclosure by removing pre-existing organic moieties from the surface of semiconductor nanocrystals with an acid and then covalently bonding the functionalized capping agents to the surface of the semiconductor nanocrystals. Examples of acids to remove pre-existing organic moieties include, for example, strong acids (e.g., HCl, HNO3, and/or H2SO4), weak acids (e.g., H3PO4), and/or organic acids (e.g., acetic acid).

Alternatively, nanocrystals are functionalized with capping agents without forming covalent bonds.

The present disclosure includes nanocrystals and at least partially capped nanocrystals made by methods described herein.

Methods of the present disclosure further includes methods of forming a film or coating including dispersing the nanocrystals or at least partially capped nanocrystals of the present disclosure in a further material to form a dispersion, and applying the dispersion to a surface. The applying methods may include spin coating, spraying, dipping, screen printing, rolling, painting, printing, ink jet printing, depositing by evaporation and/or vapor deposition.

Figure 9:
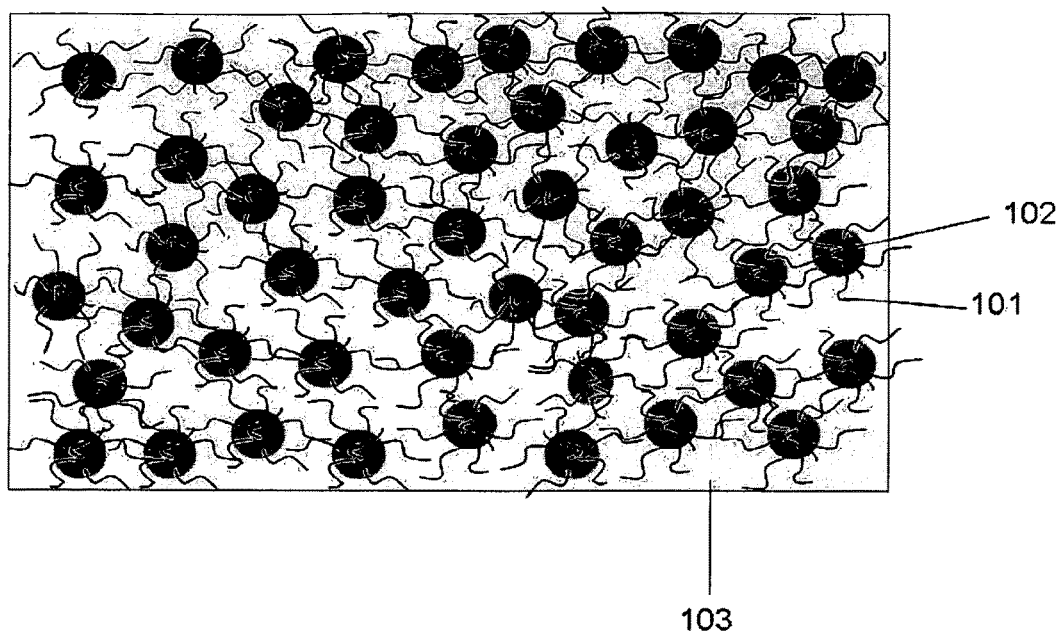
FIG. 9 exemplifies a silane capped colloidal semiconductor nanocrystals in a polymeric film.

Methods of the present disclosure include forming a nanocomposite which includes combining the nanocrystals or the at least partially capped nanocrystals of the present disclosure with a further material and forming the nanocomposite. FIG. 9 is an exemplary picture of nanocrystals (102) capped with a capping agent (101) dispersed in a polymer matrix (103).

The products and methods of the present disclosure are exemplified by the following non-limiting examples.

Example 1

Synthesis and Capping of Nanocrystals
Synthesis of Zirconium Oxide ($ZrO_2$) Nanocrystals Zirconium oxide nanocrystals having a size in the range of 1-10 nm can be prepared from precursors such as Zirconium (IV) n-butoxide, zirconium n-propoxide, Zirconium isopropoxide isopropanol or zirconium ethoxide. Zirconium n-butoxide or zirconium n-propoxide would be advantageously used as precursors depending on final product desired.

In an exemplary method, a zirconium alkoxide precursor, such as, but not limited to, Zirconium n-butoxide, zirconium n-propoxide, zirconium isopropoxide isopropanol or zirconium ethoxide, is mixed with a solvent or mixture of solvents, including benzyl alcohol, phenol, oleyl alcohol, butanol, propanol, isopropanol, water, tetrahydrofuran, ethanol, methanol, acetonitrile, toluene, PGMEA, PGPE, PGME, 2-methyl-1-propanol, or triethylene glycol monomethyl ether and sealed within an autoclave. The reaction mixture is heated to a temperature between 250-350° C. Once the reaction mixture reaches the set temperature, the temperature is maintained for a length of time ranging from 20 minutes to 24 hours depending in part on the solvent or solvent mixtures and/or the temperature of the reaction. As-synthesized zirconium oxide nanocrystals are collected as a white milky suspension.

In a further example, zirconium oxide nanocrystals were produced from a mixture of 30 millimoles of zirconium isopropoxide isopropanol or zirconium ethoxide and 300 milliliters of benzyl alcohol in an inert atmosphere which was sealed within an autoclave. The reaction mixture was heated to 350° C. at a heating rate is 10° C./min. Once the reaction mixture reached 350° C., the temperature was maintained for 20-60 min. A white milky solution of as-synthesized $ZrO_2$ nanocrystals was collected after the autoclave was cooled down to the room temperature.

In a further example, zirconium oxide nanocrystals were prepared from 45 millimoles of zirconium isopropoxide isopropanol or zirconium ethoxide mixed with 300 milliliters of benzyl alcohol in an inert atmosphere which was transferred to an autoclave. The reaction mixture was heated to 300-350° C. for 1-2 hours at a heating rate of 10° C./min. The pressure of the reaction reaches 100 to 500 psi. After the reaction was complete and the reactor was returned to room temperature, a white milky solution of as-synthesized zirconium oxide nanocrystals was collected.

An exemplary synthetic method using zirconium n-butoxide as the precursor is as follows: 21.58 g of 80% (w/w) Zirconium (IV) n-butoxide in 1-butanol solution (containing 17.26 g or 45 mmol Zirconium (IV) n-butoxide) was mixed with 300 ml of benzyl alcohol in a glove box and then transferred into an autoclave with a glass liner. The setup was sealed under an argon atmosphere to prevent oxygen and moisture contamination. The autoclave was then heated up to 325° C., kept at this temperature for one hour and then cooled down to room temperature. A white milky solution of as-synthesized zirconium oxide nanocrystals was collected.

Figure 10:
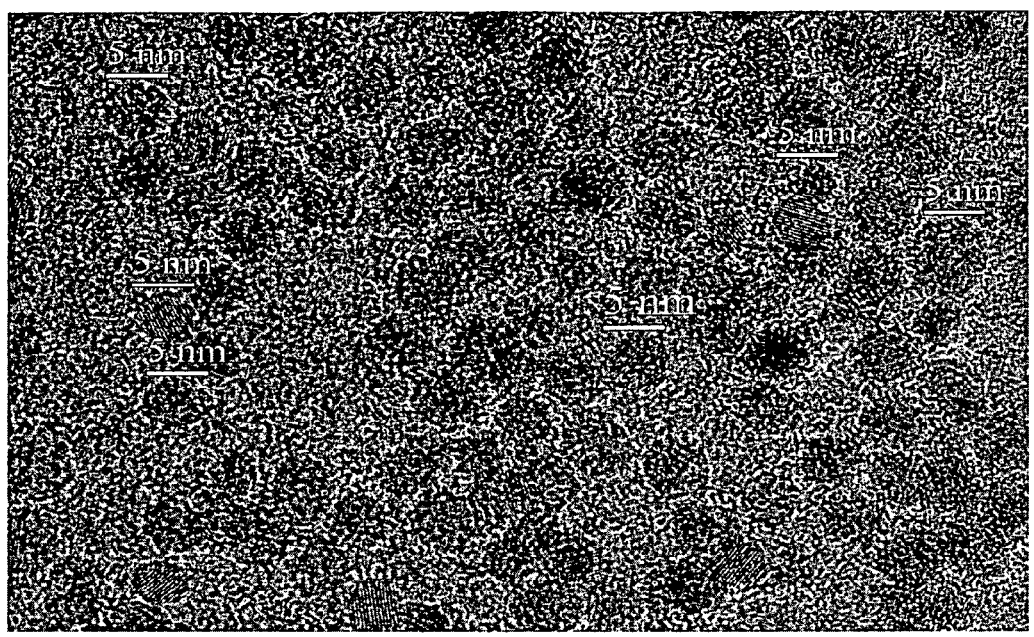
FIG. 10 shows the TEM image of nanocrystals synthesized from zirconium butoxide.

Zirconium n-butoxide is received as a solution in 1-butanol (80% w/w). 1-butanol can be removed from the precursor before the synthesis under vacuum and/or heating (30-50° C.), during the synthesis by releasing the pressure of the autoclave when the temperature reaches around 100° C. or after the reaction is completed. FIG. 10 is the TEM image of the nanocrystals obtained from the reaction without removing 1-butanol. The nanocrystals are spherical in shape and around 5 nm in diameter.

An exemplary synthetic method using zirconium n-propoxide as the precursor is as follows: 21.06 g of 70% (w/w) Zirconium (IV) n-propoxide in 1-propanol solution (containing 14.74 g or 45 mmol Zirconium (IV) n-propoxide) was mixed with 300 ml of benzyl alcohol in a glove box and then transferred into an autoclave. The setup was sealed under Argon atmosphere to prevent oxygen and moisture contamination. The autoclave was then heated up to 325° C., kept at this temperature for one hour and then cooled down to room temperature. A white milky solution of as-synthesized zirconium oxide nanocrystals was collected.

Figure 11:
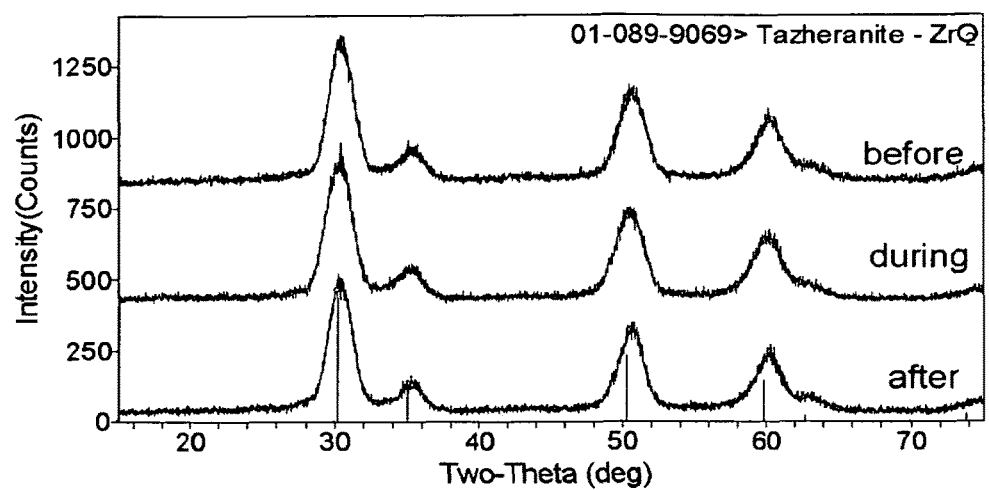
FIG. 11 shows the XRD patterns of $ZrO_2$ nanocrystals synthesized from zirconium propoxide by removing 1-propanol before, during or after the reaction.
Figure 12:
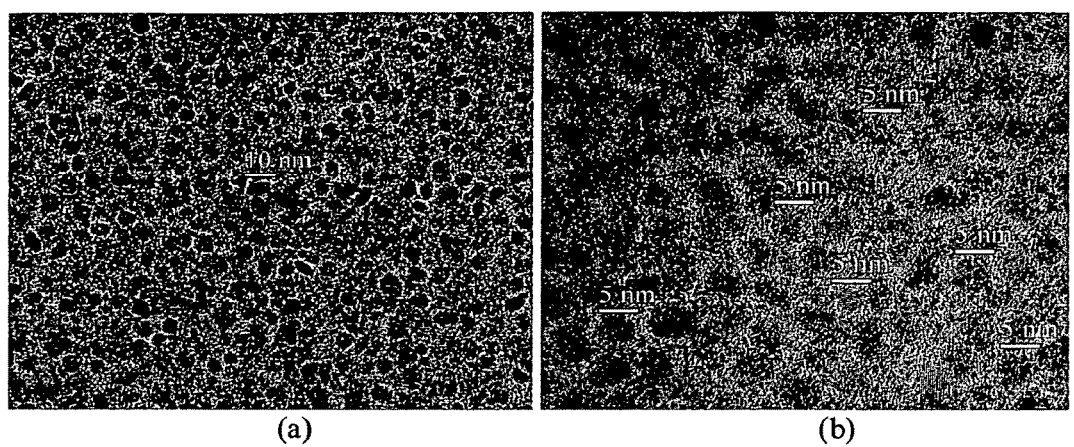
FIG. 12 shows the TEM images of $ZrO_2$ nanocrystals synthesized from zirconium propoxide by removing 1-propanol a) before, and b) after the reaction.

Zirconium n-propoxide is received as a solution in 1-propanol (70% w/w). 1-propanol can be removed from the precursor before the synthesis under vacuum and/or upon heating (30-60° C.). It can also be removed during the synthesis by releasing the pressure of the autoclave when the temperature reaches around 100° C. or it can be removed after the synthesis. The nanocrystals obtained from the reactions where 1-propanol was removed from the precursor before, during or after the reaction result in around 5 nm $ZrO_2$ nanocrystals. These nanocrystals have the same crystal structure as shown by the respective XRD patterns of the nanocrystals shown in FIG. 11. The nanocrystals obtained by removal of 1-propanol before or during the reaction are more spherical and monodisperse based on a comparison of the TEM images shown in FIG. 12 for the nanocrystals obtained with removal before the reaction and without removal of 1-propanol.

To increase the yield of the reaction without affecting the nanocrystal quality the concentration of the precursor, such as zirconium isopropoxide isopropanol, zirconium etoxide, zirconium n-propoxide or zirconium n-butoxide, can be increased 5-20 times without changing the amount of the solvent used.

$ZrO_2$ nanocrystals can be synthesized in a variety of solvents and solvent mixtures. A change in the solvent used in the synthetic method can lead to a change in the surface properties of the nanocrystals and, in some cases, can cap the nanocrystals well enough that further surface modification in order to obtain dispersions with minimal scattering may be unnecessary. A list of alternative solvents includes, but is not limited to: 1-hexanol, oleyl alcohol, oleylamine, trioctylamine, and methyl triethylene glycol. A list of alternative solvent mixtures includes, but is not limited to: mixtures of benzyl alcohol with 1-hexanol, oleyl alcohol, triethylene glycol monomethyl ether and trioctylamine.

$ZrO_2$ may also be synthesized in a different manner in order to prepare nanocrystals with a hydrophobic surface chemistry. This may be useful for applications which benefit from the use of hydrophobic solvents to create dispersions of nanocrystals. An example of the synthetic method to produce $ZrO_2$ nanocrystals with hydrophobic surface is as follows: the solvent for the $ZrO_2$ nanocrystals synthesis contains a mixture of oleyl alcohol and benzyl alcohol with different volume ratios. The volume ratio of oleyl to benzyl alcohol in which the reaction is run may be chosen from the following non-limiting list of ratios: 1:3, 1:1, or pure oleyl alcohol. In a typical reaction, 3 millimole of zirconium isopropoxide isopropanol is added to a 20 ml mixture containing 10 ml anhydrous benzyl alcohol and 10 ml oleyl alcohol in an inert atmosphere. The mixture is stirred for approximately one hour. The reaction mixture is then added to an autoclave reactor under an inert atmosphere. Then the reactor is heated to 325° C. and maintained at 325° C. for 1 hour with stirring. After cooling the nanocrystals are precipitated out of the solution with ethanol.

The exemplary synthetic methods described herein are carried out in an autoclave at temperatures which may be higher than the boiling point of some of the solvents used. This can generate pressures in the 100-900 psi range, typically around 250 psi. To eliminate the high pressures which may normally be present in the $ZrO_2$ nanocrystals synthesis, a solvent or a mixture of solvents with higher boiling points may be used. One, non-limiting, example of a higher boiling point solvent is Dowtherm MX, a mixture of alkylated aromatics, from Dow Chemicals. Dowtherm MX can be used alone or in combination with other solvents such as benzyl alcohol. When used alone for the $ZrO_2$ nanocrystal synthesis, the pressure in the autoclave reactor is less than 100 psi, and typically less than 20 psi.

A typical example of a $ZrO_2$ nanocrystal synthesis carried out in a mixture of benzyl alcohol and Dowtherm MX is as follows: 100 ml of Dowtherm MX, 8.13 millimoles of Zirconium Isopropoxide isopropanol and 30 ml of Anhydrous Benzyl Alcohol are mixed in a 250 ml flask for 30 min with magnetic stirrer at 500 rpm in a glove box. The mixture is then loaded in to a 600 ml glass-lined Parr autoclave reactor. The reactor was then sealed in the glove box. The reaction mixture is heated to 325° C. at heating rate of 10° C./min while stirring and kept at this temperature for 1 hour with stirring. After that it was cooled to room temperature and a milky white suspension of $ZrO_2$ nanocrystals is obtained.

A typical example of the procedure for a $ZrO_2$ nanocrystal synthesis using only Dowtherm MX as the solvent follows: 100 ml of Dowtherm MX is mixed with 3. 15 g of Zirconium Isopropoxide isopropanol in a 250 ml flask for 30 min at 500 rpm with magnetic stirrer in a glove box. The mixture is then loaded in to a 600 ml glass-lined Parr Reactor. The reactor was then sealed while in the glove box, before being transferred out for the reaction. The reaction mixture is heated to 325° C. at heating rate of 10° C./Min min with stirring and kept at this temperature for 1 hour with stirring. After that it was cooled to room temperature and a milky white suspension of $ZrO_2$ nanocrystals is obtained.

Alternatively, precursors other than zirconium (IV) isopropoxide isopropanol may be used to synthesize $ZrO_2$ nanocrystals in solvents with a higher boiling point than the reaction temperature, or a mixture of these solvents with benzyl alcohol. These alternative precursors may include but are not limited to zirconium (IV) ethoxide, zirconium (IV) n-propoxide, and zirconium (IV) n-butoxide.

Figure 13:
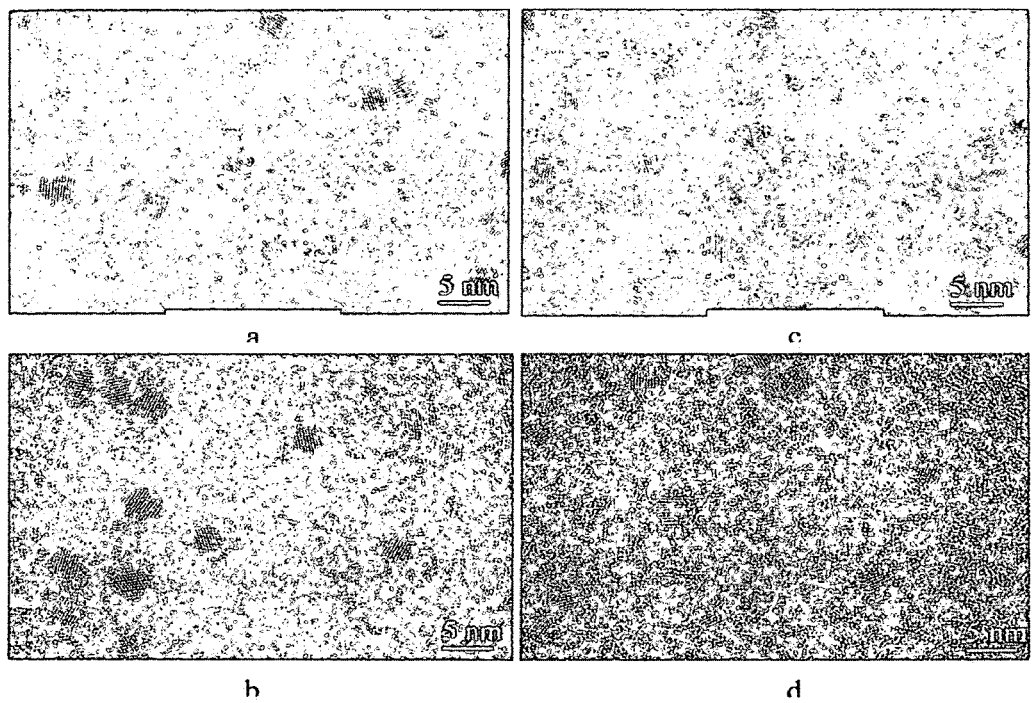
FIG. 13 shows TEM images of $ZrO_2$ nanocrystals with different sizes.

Synthesis of 1-5 nm $ZrO_2$ Nanocrystals $ZrO_2$ nanocrystals can be synthesized with average diameters from 1 to 5 nm, preferably 1 to 3 nm, by controlling the amount of water in the reaction mixture during the solvothermal synthesis. These smaller sized nanocrystals (1-5 nm) may be desirable for increased specific surface area with respect to larger (6-10 nm) nanocrystals or for use in applications where the smaller physical size may be beneficial. A typical example of the experimental protocol for the synthesis of these nanocrystals is as follows: In a vial, 30 ml of benzyl alcohol and 0.08 ml of water (4.44 mmol) were stirred for 1 hour and transferred into the glovebox. In the glovebox, 4.49 millimoles of zirconium (IV) isopropoxide isopropanol $(Zr(OPr^i)_4(HOPr^i)$—, (~1:1 water to precursor ratio) was stirred with the benzyl alcohol solution for 4 hours. The precursor was completely dissolved into the solvent and a clear solution was obtained. The reaction mixture was then transferred to an autoclave and sealed within the vessel. The reaction mixture was then heated at 325° C. for 1 hour (15 minutes ramp up to 250° C., 3 minutes ramp up to 265° C., 3 minutes ramp up to 280° C., 3 minutes ramp up to 295° C., 3 minutes ramp up to 310° C., 3 minutes ramp up to 325° C.) while stirring. After cooling to room temperature, a white slurry and a faint yellow solution were obtained. The XRD pattern of the solid matches that of $ZrO_2$ and the TEM images of the nanocrystals shows that the particle size is around 3 nm. FIG. 13 shows the TEM images of the nanocrystals obtained from 1:1, 1:2, 1:3 and 1:4 molar ratio of precursor to water in the reaction mixture, respectively. FIG. 13 shows that as the ratio of water to precursor increased the particle size gets even smaller with 1:4 water to precursor ratio resulting in the smallest average particle size (~2 nm) among the exemplary ratios of 1:1, 1:2, 1:3 and 1:4.

Alternatively $ZrO_2$ nanocrystals may be synthesized with average diameters from 1 to 5 nm, preferably 1 to 3 nm, using precursors other than zirconium (IV) isopropoxide isopropanol. These alternative precursors may include zirconium (IV) ethoxide, zirconium (IV) n-propoxide, and zirconium (IV) n-butoxide.

The heating temperature and time of the exemplary synthetic routes described herein for the synthesis of $ZrO_2$ nanocrystals can be adjusted such that the reaction temperature can be varied from 250-350° C. while the reaction time can be varied from 20 min-24 hours. Reactions carried out at the lower end of the temperature range may require longer heating times and the reactions carried out at the higher end of this temperature range may require shorter times for a complete synthesis.

Synthesis of Titanium-Zirconium Oxide ($TiO_2$—$ZrO_2$) Nanocrystals Metal-oxide nanocrystals containing both zirconium and titanium atoms can be synthesized by a modification of the synthetic route for $ZrO_2$ nanocrystals. These $TiO_2$—$ZrO_2$ metal oxide nanocrystals may be used in a variety of applications which call for the mixture of chemical properties, physical properties, or optical properties (or some combination therein) of $ZrO_2$ and $TiO_2$. One set of non-limiting examples of this $TiO_2$—$ZrO_2$ synthesis involves replacing the zirconium precursor with a mixture containing both a titanium precursor and a zirconium precursor in benzyl alcohol. Nanocrystals with different Ti/Zr atomic ratios can be made by adjusting the titanium and zirconium precursor concentrations with respect to each other while holding the total metal precursor concentration constant. $TiO_2$—$ZrO_2$ nanocrystals can be synthesized in this manner with the Ti:Zr ratio taking a value from the following non-limiting list: 1:3, 1:2, and 1:1.

A typical procedure for the synthesis of $TiO_2$—$ZrO_2$ nanocrystals with 1:1 Ti:Zr ratio is as follows: 15 mmol of zirconium isopropoxide isopropanol and 15 mmol of titanium isopropoxide were dissolved in 30 ml anhydrous benzyl alcohol under an inert atmosphere. The reaction mixture was then added to an autoclave reactor under an inert atmosphere. The reactor was heated to 300° C. and maintained at 300° C. for 1 hour with stirring. The resulting nanocrystals were precipitated out of solution with ethanol. The $TiO_2$—$ZrO_2$ nanocrystals have a size of around 5 nm based on TEM images. The elemental analysis results confirmed that the Ti/Zr atomic ratio in the sample was generally consistent with the atomic ratio of the two precursors.

A typical procedure for the synthesis of $TiO_2$—$ZrO_2$ nanocrystals with a Ti:Zr ratio of 1:2 involves the following: 20 mmol of zirconium isopropoxide isopropanol and 10 mmol of titanium isopropoxide were dissolved in 30 ml anhydrous benzyl alcohol under an inert atmosphere. The reaction mixture was then added to an autoclave reactor under an inert atmosphere. The reactor was heated to 300° C. and maintained at 300° C. for 1 hour with stirring. The resulting nanocrystals were precipitated out of solution with ethanol.

Alternatively the synthesis of $TiO_2$—$ZrO_2$ nanocrystals with various values of x may be synthesized using a mixture of titanium and zirconium which is not a mixture of zirconium isopropoxide isopropanol and titanium isopropoxide. The mixture of zirconium and titanium precursors may include a zirconium precursor from a non-limiting list including: zirconium ethoxide, zirconium n-propoxide, and zirconium n-butoxide, and a titanium precursor including titanium ethoxide, titanium n-propoxide, and titanium n-butoxide.

Synthesis of Hafnium-Zirconium Oxide ($HfO_2$—$ZrO_2$) Nanocrystals

Metal-oxide nanocrystals containing both zirconium and hafnium atoms in a single nanocrystal can be synthesized. $HfO_2$—$ZrO_2$ oxide nanocrystals with an 1:1 atomic ratio of hafnium to zirconium can be produced in an inert atmosphere by mixing 2 millimoles of hafnium isopropoxide isopropanol and 2 millimoles of zirconium chloride with 10 grams of trioctylphosphine oxide. The reaction mixture is then heated to 100° C., at a heating rate of 10° C./min, with vigorous stirring under an inert atmosphere. After 1 hour stirring at 100° C., trioctylphosphine oxide is melted and the hafnium and zirconium precursors are dissolved in melted trioctylphosphine oxide. The solution is then rapidly heated to 350° C., at a heating rate of 10° C. /min, and kept at 350° C. for two hours. A white powder appeared and the solution became milky. After two hours, the reaction mixture is allowed to cool. When the reaction mixture reached 70° C., acetone is added, causing the nanocrystals to precipitate. The resulting hafnium-zirconium oxide nanomaterial is rod-like in shape (i.e., "nanorods").

In a further example, hafnium-zirconium oxide nanocrystals, may be prepared with a range of values for the hafnium to zirconium atomic ratio. For example, nanocrystals with a Hf:Zr ratio of 1:4 can be prepared with the following: 0.8 mmol of hafnium isopropoxide isopropanol, 1.2 mmol of zirconium isopropoxide isopropanol, 2 mmol of zirconium chloride, and 10 grams of trioctylphosphine oxide are mixed together in an inert atmosphere. The feeding sequence is arbitrary. The reaction mixture is heated to 100° C., at a heating rate of 10° C./min, with vigorous stirring under an inert atmosphere. The solution is then rapidly heated to 350° C., at a heating rate 10° C./min, and kept at 350° C. for two hours. A white powder forms and the solution becomes milky. After two hours, the reaction mixture is allowed to cool. When the reaction mixture reached 70° C., acetone is added, causing the $HfO_2$—$ZrO_2$ nanocrystals to precipitate. The precipitate is collected by centrifugation and the supernatant is decanted and discarded. The redispersion-precipitation procedure is repeated 4 times. The shape of hafnium zirconium oxide nanomaterials range from spheres to rod-like (i.e., "nanorods").

Synthesis of Hafnium Oxide ($HfO_2$) Nanocrystals

Figure 14:
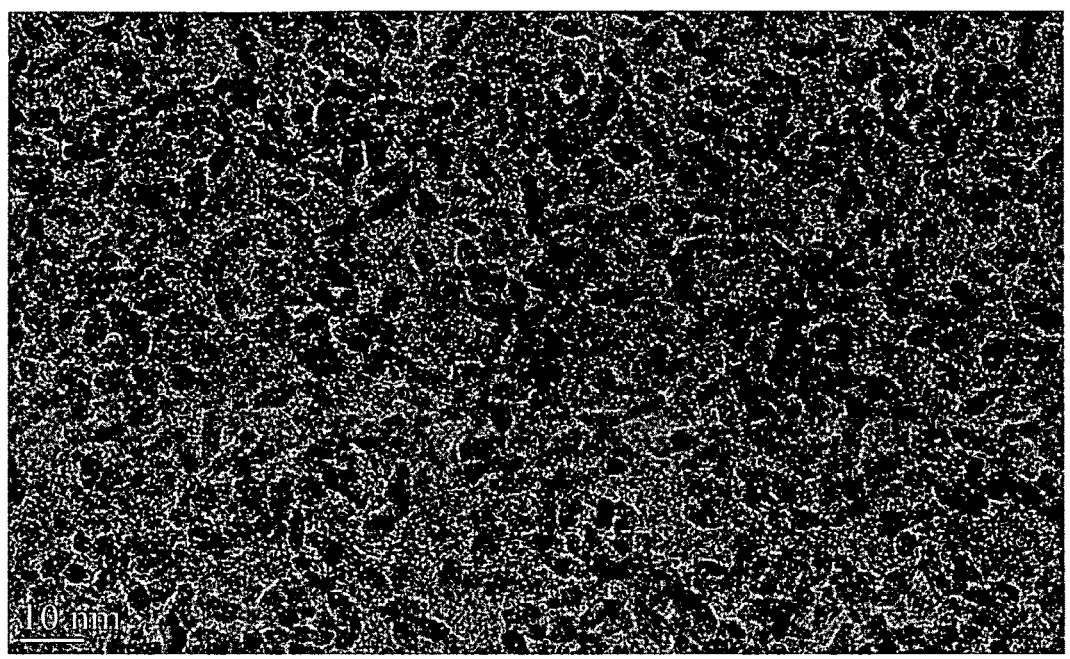
FIG. 14 shows the TEM image of the as-synthesized $HfO_2$ nanocrystals with rice-like morphology.

Hafnium oxide nanocrystals having a size in the range of 1-10 nm are synthesized in an inert atmosphere using a solvothermal synthetic method. An example of the synthetic method is as follows: a sample of hafnium alkoxide precursor, such as, but not limited to, hafnium isopropoxide isopropanol, or hafnium ethoxide, was mixed with an organic alcohol, such as, but not limited to, benzyl alcohol or 2-methyl-1-propanol, and sealed within an autoclave. The reaction mixture was heated to 250-350° C. Once the reaction mixture reached the set temperature, the temperature was maintained for a set time which can range from 20 minutes to 24 hours. As-synthesized hafnium oxide nanocrystals were collected as a white milky suspension. FIG. 14 shows a TEM image of the as synthesized $HfO_2$ nanocrystals which have a rice shape and are less than 10 nm in size.

A method of producing 6 g of hafnium oxide nanocrystals of the present disclosure includes mixing, in an inert atmosphere, a sample of 30 millimoles of hafnium ethoxide or hafnium isopropoxide isopropanol with 300 milliliters of benzyl alcohol which is then transferred to an autoclave. The reaction mixture is heated at 300-350° C. for 1-2 hours, with a heating ramp rate of 10° C./min. During reaction the pressure in the autoclave is less than 500 psi (~35 atmospheres). After the reaction time has elapsed and the reactor is returned to room temperature, a white milky solution of as-synthesized hafnium oxide nanocrystals is collected.

Alternatively, precursors other than hafnium (IV) isopropoxide isopropanol or hafnium ethoxide, may be used to synthesize $HfO_2$ nanocrystals in solvents with a higher boiling point than the reaction temperature, or a mixture of these solvents with benzyl alcohol. These alternative precursors may include but are not limited to hafnium (IV) n-propoxide, and hafnium (IV) n-butoxide.

Figure 15:
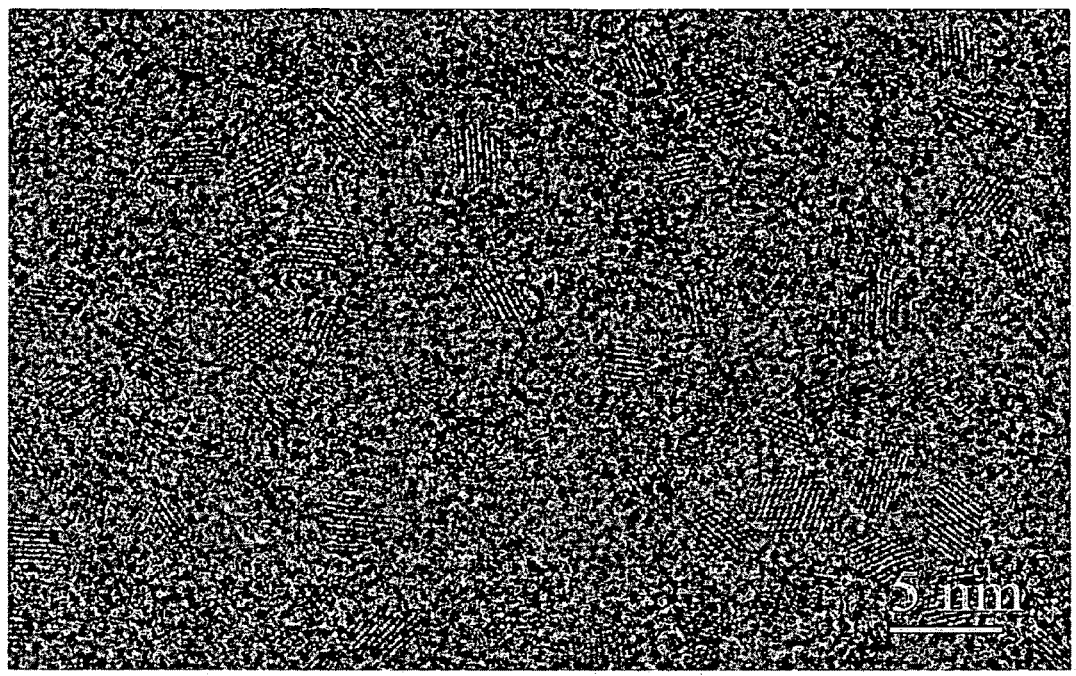
FIG. 15 shows a TEM image of the 2-5 nm $HfO_2$ nanocrystal.

Synthesis of 1-5 nm $HfO_2$ Nanocrystals $HfO_2$ nanocrystals can be synthesized with diameters of 1-5 nm, preferably 1-3 nm, by controlling the amount of water in the reaction mixture during the solvothermal synthesis. These smaller sized nanocrystals may be desirable for their increased specific surface area with respect to larger nanocrystals or for use in applications where the smaller physical size may be beneficial. A typical example of the experimental protocol for the addition of water in order to produce hafnium oxide nanocrystals in the 1-5 nm size range follows: 30 ml of benzyl alcohol and 0.1 ml of water are stirred for 3 hours in a vial which is then transferred into the drybox. In the drybox, 4.45 millimole of $Hf(OPr^i)_4(HOPr^i)$ (2.113 g) is stirred in the water/benzyl alcohol solution overnight with 1:1 water to hafnium isopropoxide molar ratio. The precursor completely dissolves into the solvent mixture. The reaction mixture is transferred to an autoclave and sealed within the vessel. The reaction mixture is then heated to 325° C., using a heating mantle, for 1 hour with stirring. After cooling to room temperature, a white slurry with a faint yellow solution are obtained. FIG. 15 shows the TEM images of the nanocrystal which are 2-5 nm in size.

Alternatively, HfO$_2$ nanocrystals may be synthesized with diameters of 1-5 nm, preferably 1-3 nm, starting from precursors other than hafnium isopropoxide isopropanol. These alternative precursors may include but are not limited to hafnium ethoxide, hafnium n-propoxide, and hafnium n-butoxide.

Hafnium alkoxide to water ratio can be in the range from 1:1 to 1:4.

The heating temperature and time of the exemplary synthetic routes described herein for the synthesis of HfO$_2$ nanocrystals can be adjusted such that the reaction temperature can be varied from 250-350° C. while the reaction time can be varied from 20 min-24 hours. Reactions carried out at the lower end of the temperature range may require longer heating times and the reactions carried out at the higher end of this temperature range may require shorter times.

Synthesis of Zinc Oxide (ZnO) Nanocrystals

Organosilane capped zinc oxide nanocrystals were produced as follows. 2.7 grams of zinc acetate dihydrate were dissolved in 140 ml of ethanol and heated to 80° C. with stirring. Once the zinc acetate was completely dissolved and the solution turned clear, the reaction mixture was cooled in an ice-water bath. In a separate flask, a 0.72 gram sample of lithium hydroxide monohydrate was mixed with 60 milliliters of ethanol and sonicated for 30 minutes. This lithium hydroxide/ethanol solution was added drop-wise, at a rate of 3 drops per second, to the zinc acetate dihydrate/ethanol solution in the ice-water bath. Once the entire lithium hydroxide/ethanol solution was added, the reaction mixture was warmed to room temperature and stirred for 1 hour. A 0.25 gram sample of methoxy(triethyleneoxypropyl) trimethoxysilane was mixed with 5 milliliters of ethanol and then injected into the reaction mixture. The entire reaction mixture was stirred for 12 hours at room temperature, forming as-synthesized organosilane-capped zinc oxide nanocrystals. These nanocrystals have a spherical shape with diameters in the 3-6 nm range.

In a further example, larger-sized (equal to or greater than 5 nm and less than 10 nm) organosilane-capped zinc oxide nanocrystals were produced as follows: 2.7 grams of zinc acetate dihydrate was dissolved in 140 milliliters of ethanol and heated to 80° C. with stirring. Once the zinc acetate was completely dissolved and the solution turned clear, the reaction mixture was cooled in an ice-water bath. In a separate flask, a 0.72 gram sample of lithium hydroxide monohydrate was mixed with 60 milliliters of ethanol and sonicated for 30 minutes. This solution was added drop-wise, at a rate of 3 drops per second, to the zinc acetate dihydrate/ethanol solution in the ice-water bath. Once the entire lithium hydroxide/ethanol solution was added, the reaction mixture was placed into a 60° C. hot water bath and stirred for 1 hour. A 0.25 gram sample of methoxytri(ethyleneoxy)propyltrimethoxysilane was mixed with 5 milliliters of ethanol and then injected into the reaction mixture. The entire reaction mixture was stirred for 12 hours at 60° C., forming the as synthesized organosilane capped zinc oxide nanocrystals with diameters equal to or grater than 5 nm and less than 10 nm.

A method of producing organosilane-capped zinc oxide nanocrystals is provided. A 21.28 gram sample of zinc acetate dihydrate is dissolved in 1080 ml of ethanol and heated to ~80° C. with stirring. Once the zinc acetate is completely dissolved and the solution turned clear, the reaction mixture is cooled in an ice-water bath. In a separate flask, a 5.76 gram sample of lithium hydroxide monohydrate is mixed with 480 ml of ethanol and sonicated for 30 minutes. This solution is added drop-wise to the zinc acetate dihydrate/ethanol solution in the ice-water bath. Once the entire lithium hydroxide/ethanol solution is added, the reaction mixture is warmed to room temperature and stirred for 0.5 hours. A 2.0 gram sample of methoxytri(ethyleneoxy) propyltrimethoxysilane is mixed with 15 milliliters of ethanol and then injected into the reaction mixture. The entire reaction mixture is stirred for 16 hours at room temperature, forming as-synthesized organosilane capped zinc oxide nanocrystals. These nanocrystals are spherical with 3-6 nm in diameter.

Alternatively, 4 times more concentrated methoxytri(ethyleneoxy)propyl trimethoxysilane with respect to ethanol was added to the reaction mixture during the synthesis of 3-6 and 5-10 nm ZnO nanocrystals to provided increased capping and dispersibility of the nanocrystals in polar solvents.

Figure 16:
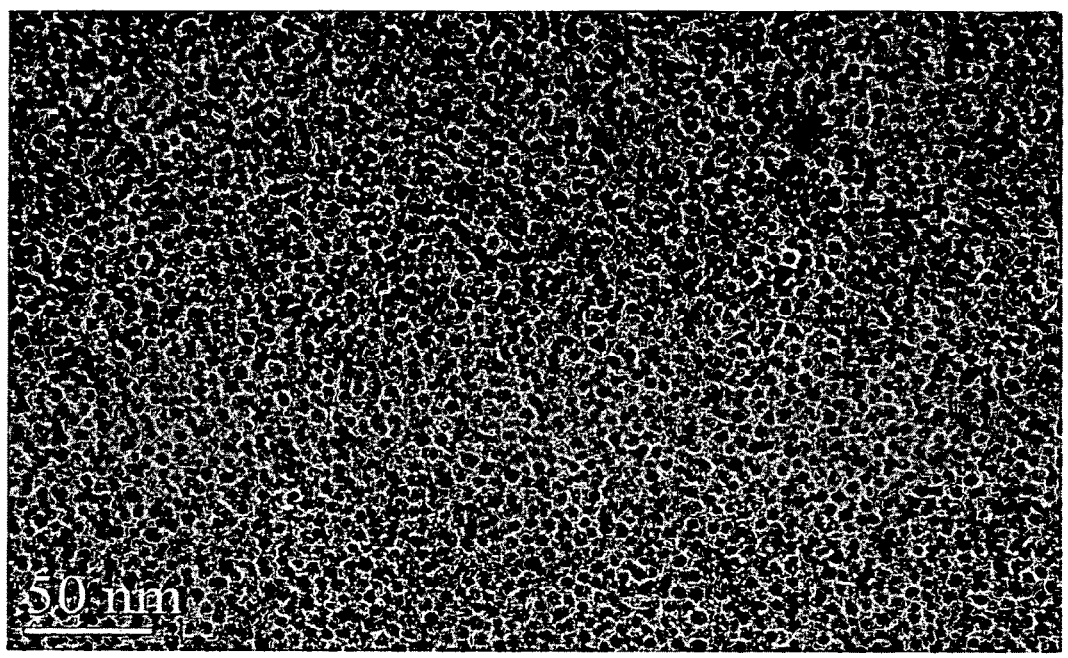
FIG. 16 shows a TEM image of ZnO nanocrystals.

ZnO nanocrystals can be synthesized by another liquid synthetic method. A typical synthesis is as follows: 50 mmol zinc acetate dihydrate was added to 500 ml of absolute ethanol in a flask. The zinc acetate was dissolved completely by heating the flask in a water bath at 80° C. Separately, 200 mmol lithium hydroxide monohydrate was dissolved in 125 ml methanol (or ethanol) at room temperature by vigorous stirring. The LiOH solution was then poured into the refluxing Zn(Ac)$_2$ solution. Following the addition, the heat was removed and the reaction mixture was cooled in air for 20 minutes. A transparent solution resulted. This solution was then re-heated to 80° C. for 30 minutes, until a white precipitate formed. The precipitate is separated from the solution by centrifuging at 4500 rpm at 4° C. for 20 minutes, and washed with THF. A TEM image of the product is shown in FIG. 16.

Alternatively, in the above reactions used to produce ZnO nanocrystals, the molar ratio of the lithium hydroxide to zinc salt can be varied in the range from 1:1.4 to 1:4.

Alternatively, in the above reactions used to produce ZnO nanocrystals, KOH or NaOH can be used as a substitute for lithium hydroxide.

Synthesis of Yttrium Oxide (Y$_2$O$_3$) Nanocrystals

Yttrium oxide nanocrystals were produced from 1 gram of yttrium oleate and 5.96 grams of dodecylamine which were mixed together and purged with an inert gas for 10 minutes. The reaction mixture was then heated to 70° C. in 20 minutes, maintained at 70° C. for 20 minutes, then further heated to 259° C. in 20 minutes and maintained at 259° C. for 2 hours, with stirring under an inert atmosphere. The reaction mixture was then allowed to cool. At 70° C., 20 ml of ethanol were added to the reaction mixture to precipitate the yttrium oxide nanocrystals.

In another example, yttrium oxide nanodisks (disk-shaped nanocrystals) with a diameter of 20 nanometers were produced from a mixture of 1 gram of yttrium oleate and 5 ml of oleylamine which were mixed and purged with an inert gas such as Argon for 10 minutes. The reaction mixture was then heated to 70° C. in 20 minutes, maintained at 70° C. for 20 minutes, heated to 250° C. in 20 minutes, and finally maintained at 250° C. for 2 hours while stirring under an inert gas atmosphere. The reaction mixture was then allowed to cool. At 70° C., 20 milliliters of ethanol was added to the reaction mixture to precipitate the yttrium oxide nanodisks.

In another example, yttrium oxide nanodisks with a diameter of 10 nanometers were produced from 2 grams of yttrium oleate and 25 ml of oleylamine which were mixed and purged with argon for 10 minutes. The reaction mixture was then heated to 70° C. in 20 minutes, maintained at 70° C. for 20 minutes, heated to 280° C. in 20 minutes, and finally maintained at 280° C. for 2 hours while stirring under argon protection. The reaction mixture was then allowed to cool. At 70° C., 20 milliliters of ethanol was added to the reaction mixture to precipitate the yttrium oxide nanodisks.

In a further example, yttrium oxide nanodisks with a diameter of 10 nanometers were produced from 2 grams of yttrium oleate and 25 ml of oleylamine which were mixed and purged with argon for 10 minutes. The reaction mixture was then heated to 70° C. in 20 minutes, maintained at 70° C. for 20 minutes, heated to 230° C. in 20 minutes, and finally maintained at 230° C. for 2 hours while stirring under argon protection. The reaction mixture was then allowed to cool. At 70° C., 20 milliliters of ethanol was added to the reaction mixture to precipitate out the yttrium oxide nanodisks.

In a further example, yttrium oxide nanocrystals were produced from 2.15 grams of yttrium oleate and 23 grams of dodecylamine which were mixed together and purged with an inert gas for 10 minutes. The reaction mixture was then heated to 70° C. in 20 minutes, maintained at 70° C. for 20 minutes, then heated to 259° C. in 20 minutes and maintained at 259° C. for 2 hours, with stirring under an inert atmosphere. The reaction mixture was then allowed to cool. At 70° C., 20 milliliters of ethanol was added to the reaction mixture to precipitate the yttrium oxide nanocrystals. The product has a flake-like shape, where the flakes have a thickness of 2 nm.

Example 2

Removing Ligands from Surface of Nanocrystals

Hydrochloric acid treatment of the as-synthesized $HfO_2$ and $ZrO_2$ nanocrystal surface may be necessary to remove the organic moieties or capping agents which are on the surface of the nanocrystals before any further modification is possible. An exemplary method includes suspending as-synthesized or purified nanocrystals in water by stirring and adjusting the suspension to a pH of 1 using a 1 M hydrochloric acid solution. The solution changes from a milky white suspension to a transparent solution upon the addition of hydrochloric acid. The solution may be stirred overnight at room temperature to allow the reaction to progress further. When the solution is added to tetrahydrofuran, a white solid precipitates. After centrifugation, the precipitate can be collected. The process of re-suspending the particles in tetrahydrofuran and then centrifuging the mixture and collecting the precipitate may be repeated until the pH of the supernatant is in the 5-7 range.

Example 3

Cap Exchange of Nanocrystals

Cap exchange of $ZrO_2$, $HfO_2$ and $TiO_2$—$ZrO_2$ nanocrystals After the synthesis of the $ZrO_2$, $HfO_2$ and $TiO_2$—$ZrO_2$ nanocrystals, the as-synthesized nanocrystals are transferred into a round bottom flask to perform the cap exchange. The as-produced nanocrystals may be capped by the solvent or reaction by-products that are present during synthesis. It may be desirable to exchange the capping molecules of the nanocrystals for a variety of reasons, including, but not limited to: increased dispersibility in solvent or some other matrix, having different optical properties, or having different chemistry at the surface of the nanocrystals. The cap exchange process may involve dispersing or suspending the as-synthesized nanocrystals in a solvent or reaction mixture along with a certain amount of capping agents. This reaction may be carried out at an elevated temperature and for a certain amount of time in order to promote cap exchange. A non-limiting list of choices for capping agents to perform the cap exchange on the as-synthesized $ZrO_2$, $HfO_2$ and $TiO_2$—$ZrO_2$ nanocrystals includes: methoxytri(ethelyneoxy)propyltrimethoxy silane, 2-[2-(2-methoxyethoxy)ethoxy] acetic acid, 3-(methacryloyloxy)propyl trimethoxysilane and other silanes, carboxylic acids and alcohols. The cap exchange may be carried out in benzyl alcohol or other solvent or mixtures of solvents.

Cap exchange of the as-synthesized $ZrO_2$, $HfO_2$ and $TiO_2$—$ZrO_2$ nanocrystals may be carried out using methoxytri(ethelyneoxy)propyltrimethoxy silane as the capping agent. The methoxytri(ethelyneoxy)propyltrimethoxy silane may be injected into a reaction vessel (typically a round bottom flask) containing the as-synthesized nanocrystals reaction mixture. The weight ratio of methoxytri(ethelyneoxy)propyltrimethoxy silane to the as synthesized nanocrystals may range from 1:5 to 3:2. Then the mixture is heated to 80-150° C. for an interval that may be as short as 10 minutes or as along as 3 hours. A typical procedure for a methoxy(triethelyneoxy)propyltrimethoxy silane cap exchange on as-synthesized nanocrystals involves the following: 1 g of methoxy(triethelyneoxy)propyltrimethoxysilane capping agent was added to a round bottom flask which holds the reaction mixture containing 5 g of as-synthesized $ZrO_2$, $HfO_2$ or $TiO_2$—$ZrO_2$ nanocrystals. During the addition of the capping agent the mixture was stirred continuously. The suspension was heated up to 80-150° C. and kept at that temperature while continuing to stir for 10 min-1 hour. Afterwards, the reaction was allowed to cool to room temperature.

Alternatively, the cap exchange of the $ZrO_2$, $HfO_2$ and $TiO_2$—$ZrO_2$ nanocrystals with methoxy(triethelyneoxy)propyltrimethoxy silane as the capping agent may be carried out on suspensions of nanocrystals other than the as-synthesized reaction mixture. Similar reactions may be carried out on suspensions of nanocrystals including, but not limited to, suspensions containing: nanocrystals which have previously undergone cap-exchange, as-synthesized nanocrystals which have previously undergone purification, nanocrystals which have had the capping agents removed by acid treatment, and nanocrystals which have been transferred to different solvents. Alternative solvents for cap exchange may be chosen from a list including, but not limited to: benzyl alcohol, propylene glycol monomethyl ether (PGME), propylene glycol methyl ether acetate (PGMEA), ethyl lactate (EL), and 2-propoxy-propanol (PnP), acetone, tetrahydrofuran, phenol, oleyl alcohol, toluene, butanol, propanol, isopropanol, ethanol, water and mixtures thereof.

Cap exchange of the as-synthesized $ZrO_2$, $HfO_2$ and $TiO_2$—$ZrO_2$ nanocrystals may be carried out using 2-[2-(2-methoxyethoxy)ethoxy] acetic acid as the capping agent. The 2-[2-(2-methoxyethoxy)ethoxy] acetic acid may be injected into a reaction vessel (typically a round bottom flask) containing the as-synthesized nanocrystals reaction mixture. The amount of 2-[2-(2-methoxyethoxy)ethoxy] acetic acid may be as little as 0.4 g or may be as much as 1.5 g per gram of as-synthesized $ZrO_2$, $HfO_2$ or $TiO_2$—$ZrO_2$ nanocrystals. Then the mixture may either be kept at a temperature as low as 20° C. or heated as high as 50° C. for an interval that may be as short as 30 minutes or as along as 3 hours. A typical procedure for a 2-[2-(2-methoxyethoxy)ethoxy] acetic acid cap exchange reaction performed on as-synthesized nanocrystals involves the following: 2 g of 2-[2-(2-methoxyethoxy)ethoxy] acetic acid is added to a round bottom flask which holds the reaction mixture containing 5 g of as-synthesized nanocrystals. During the addition the mixture is stirred continuously. The suspension is kept at room temperature while continuing to stir for 1 hour.

Alternatively, the cap exchange of the $ZrO_2$, $HfO_2$ and $TiO_2$—$ZrO_2$ nanocrystals with 2-[2-(2-methoxyethoxy)ethoxy] acetic acid as the capping agent may be carried out on suspensions of nanocrystals other than the as-synthesized reaction mixture. Similar reactions may be carried out on suspensions of $ZrO_2$, $HfO_2$ or $TiO_2$—$ZrO_2$ nanocrystals including, but not limited to, suspensions containing: nanocrystals which have previously undergone cap-exchange, as-synthesized nanocrystals which have previously undergone purification, nanocrystals which have had the capping agents removed by acid treatment, and nanocrystals which have been transferred to different solvents. Alternative solvents for cap-exchange reactions may be chosen from a list including, but not limited to: benzyl alcohol, propylene glycol monomethyl ether (PGME), propylene glycol methyl ether acetate (PGMEA), ethyl lactate (EL), and 2-propoxy-propanol (PnP), acetone, tetrahydrofuran, phenol, oleyl alcohol, toluene, butanol, propanol, isopropanol, ethanol, water, cyclic ketones and mixtures thereof.

Cap exchange of the as-synthesized $ZrO_2$, $HfO_2$ and $TiO_2$—$ZrO_2$ nanocrystals may be carried out using 3-(methacryloyloxy)propyl trimethoxysilane as the capping agent. The 3-(methacryloyloxy)propyl trimethoxysilane may be injected into a reaction vessel (typically a round bottom flask) containing the as-synthesized nanocrystals reaction mixture. The amount of 3-(methacryloyloxy)propyl trimethoxysilane may be as little as 0.8 g or may be as much as 1.5 g per gram of as-synthesized nanocrystals. Then the mixture is heated to 120° C. for an interval that may be as short as 30 minutes or as along as 1 hour. A typical procedure for a 3-(methacryloyloxy)propyl trimethoxysilane cap exchange performed on as-synthesized nanocrystals involves the following: 4 g of 3-(methacryloyloxy)propyl trimethoxysilane is added to a round bottom flask which holds the reaction mixture containing 5 g of as-synthesized $ZrO_2$, $HfO_2$ or $TiO_2$—$ZrO_2$ nanocrystals. During the addition of the capping agent the mixture is stirred continuously. The suspension is heated up to 120° C. and kept at that temperature while continuing to stir for 1 hour. Afterwards, the reaction is allowed to cool to room temperature.

Alternatively, the cap exchange of the $ZrO_2$, $HfO_2$ and $TiO_2$—$ZrO_2$ nanocrystals with 3-(methacryloyloxy)propyl trimethoxysilane as the capping agent may be carried out on suspensions of nanocrystals other than the as-synthesized reaction mixture. Similar reactions may be carried out on suspensions of nanocrystals including, but not limited to, suspensions containing: nanocrystals which have previously undergone cap-exchange, as-synthesized nanocrystals which have previously undergone purification, nanocrystals which have had the capping agents removed by acid treatment, and nanocrystals which have been transferred to different solvents. Alternative solvents for dispersion of the nanocrystals during the cap exchange reaction may be chosen from a list including, but not limited to: benzyl alcohol, propylene glycol monomethyl ether (PGME), propylene glycol methyl ether acetate (PGMEA), ethyl lactate (EL), and 2-propoxy-propanol (PnP), acetone, tetrahydrofuran, phenol, oleyl alcohol, toluene, butanol, propanol, isopropanol, ethanol, water, cyclic ketones and mixtures thereof.

Cap exchange of the as-synthesized $ZrO_2$, $HfO_2$ and $TiO_2$—$ZrO_2$ nanocrystals may be carried out using 3-(methacryloyloxy)propyl trimethoxysilane and methoxy(triethelyneoxy)propyltrimethoxy silane as capping agents. An exemplary cap exchange reaction of $ZrO_2$ nanocrystals is as follows: 500 mg as synthesized $ZrO_2$ was mixed with 25 mg 3-(methacryloyloxy)propyl trimethoxysilane in 5 ml PGMEA at 100° C. for 1 hour. 150 mg of methoxy(triethelyneoxy)propyltrimethoxy silane is then added to the suspension and the mixture was stirred at 100° C. for another hour. The product mixture was washed with heptanes and white precipitate is collected.

The as-produced nanocrystals of $ZrO_2$, $HfO_2$ and $TiO_2$—$ZrO_2$ may also be capped in order to facilitate dispersion in hydrophobic solvents and matrices. The cap exchange process may involve dispersing or suspending the as-synthesized nanocrystals, along with a certain amount of capping agent or capping agents, in a relatively hydrophobic solvent, chosen from a list of solvents including but not limited to: naptha, toluene, heptane, pentane, decane, chloroform. This cap exchange reaction may be carried out at room temperature or an elevated temperature and for an amount of time ranging from a few minutes to days in order to promote cap exchange. A list of choices for capping agents that may make the surface of the as-synthesized $ZrO_2$, $HfO_2$ and $TiO_2$—$ZrO_2$ nanocrystals more compatible with hydrophobic solvents and media includes, but is not limited to: stearic acid, oleic acid, and octadecyltrimethoxysilane. In a typical reaction: 2 g oleic acid is added to a suspension containing 2 g of as-synthesized nanocrystals in 20 ml of toluene. During and after the addition of the capping agent the mixture is continuously stirred. The reaction mixture is allowed to react for between several minutes and several hours before purification is then carried out.

Cap exchange of the as-synthesized $ZrO_2$, $HfO_2$ and $TiO_2$—$ZrO_2$ nanocrystals may be carried out using methoxypoly(ethelyneoxy)propyltrimethoxy silane as capping agent. Alternatively, the cap exchange of the $ZrO_2$, $HfO_2$ and $TiO_2$—$ZrO_2$ nanocrystals with methoxypoly(ethelyneoxy)propyltrimethoxy silane as the capping agent may be carried out on suspensions of nanocrystals other than the as-synthesized reaction mixture. Similar reactions may be carried out on suspensions of nanocrystals including, but not limited to, suspensions containing: nanocrystals which have previously undergone cap-exchange, as-synthesized nanocrystals which have previously undergone purification, nanocrystals which have had the capping agents removed by acid treatment, and nanocrystals which have been transferred to different solvents. Alternative solvents for dispersion of the nanocrystals during the cap exchange reaction may be chosen from a list including, but not limited to: benzyl alcohol, propylene glycol monomethyl ether (PGME), propylene glycol methyl ether acetate (PGMEA), ethyl lactate (EL), and 2-propoxy-propanol (PnP), acetone, tetrahydrofuran, phenol, oleyl alcohol, toluene, butanol, propanol, isopropanol, ethanol, water, cyclic ketones and mixtures thereof.

Cap-Exchange of Yttrium Oxide Nanocrystals

Organosilane capped yttrium oxide nanocrystals can be produced via a cap exchange process involving as synthesized yttrium oxide nanocrystals and methoxy(triethyleneoxy)propyltrimethoxysilane. As-produced yttrium oxide nanocrystals and methoxytri(ethyleneoxy)propyltrimethoxysilane were mixed together in tetrahydrofuran. The mixture was then heated to 200° C. for 2-4 hours inside an autoclave. After the reaction time expired the mixture was allowed to cool to room temperature.

Alternatively the cap exchange process may be carried of other organosilanes, organocarboxylic acids and organoalcohols. Similar reactions may be carried out on suspensions of nanocrystals including, but not limited to, suspensions containing: nanocrystals which have previously undergone cap-exchange, as-synthesized nanocrystals which have previously undergone purification, nanocrystals which have had the capping agents removed by acid treatment, and nanocrystals which have been transferred to different solvents. Alternative solvents for dispersion of the nanocrystals during the cap exchange reaction may be chosen from a list including, but not limited to: benzyl alcohol, propylene glycol monomethyl ether (PGME), propylene glycol methyl ether acetate (PGMEA), ethyl lactate (EL), and 2-propoxypropanol (PnP), acetone, phenol, oleyl alcohol, toluene, butanol, propanol, isopropanol, ethanol, water, cyclic ketones and mixtures thereof.

Cap-Exchange of ZnO Nanocrystals

When the ZnO nanocrystals are synthesized without the addition of a capping agent during the synthesis, they can be capped after the synthesis is complete with 3-(methacryloyloxy)propyl trimethoxysilane, methoxytri(ethelyneoxy)propyltrimethoxy silane, 2,2,2-methyoxyethyoxyethyoxy-acetic acid or a combination of these materials. The capping with 2,2,2-methyoxyethyoxyethyoxy-acetic acid can be carried out at room temperature or with the aid of sonication or heating of the suspension to 80° C. or with a combination of both heating and sonication. A typical method is as follows: After the synthesis 4 g of as-synthesized precipitate is re-dispersed in PGMEA in a round bottom flask. To this suspension 2 g of 2,2,2-methyoxyethyoxyethyoxy-acetic acid is added while stirring. The suspension is then exposed to brief (<1 minute) sonication to aid in the capping reaction. The capped nanocrystals are then precipitated out with THF and heptane, with the 1:1:3 volume ratio of nanocrystal:THF:heptane. The precipitates are collected by centrifugation at 6500 rpm.

Example 4

Purifying Nanocrystals

As-Synthesized $ZrO_2$, $HfO_2$ and $TiO_2$—$ZrO_2$ Nanocrystals

The as synthesized white milky nanocrystal suspension collected after the autoclave synthesis of the $ZrO_2$, $HfO_2$ and $TiO_2$—$ZrO_2$ nanocrystals can be purified. An exemplary method includes mixing the suspensions of nanocrystals with ethanol and centrifuging (8000 rpm for 30 minutes) to separate the nanocrystals. After decanting and discarding the supernatant, a white precipitate is collected. The wet nanocrystals are suspended in additional ethanol by sonication, stirring or shaking and suspension is centrifuged again. These resuspension steps, which consist of ethanol addition, centrifugation and collection of the resultant powder are repeated as many as 4 more times to obtain purified nanocrystals.

$ZrO_2$ Nanocrystals with Hydrophobic Surface

To purify the nanocrystals they are dispersed in hexane, and then precipitated out using ethanol as the antisolvent. The resultant mixture is then centrifuged and the nanocrystals are collected. This purification process is repeated three times to get nanocrystals that are easily dispersible into hydrophobic solvents such as naphtha and heptane.

$ZrO_2$, $HfO_2$ and $TiO_2$—$ZrO_2$ Nanocrystals

After synthesis, capping and or cap exchange, $ZrO_2$, $HfO_2$ and $TiO_2$—$ZrO_2$ nanocrystals may be purified or further purified. One exemplary purification of the nanocrystals after being synthesized in benzyl alcohol or mixture of benzyl alcohol with other solvents may include: addition of THF to the reactions mixture in a 2:1 volume ratio of THF to the reaction mixture followed by addition of heptane in a 7-9 to 1 volume ratio of heptane to the reaction mixture. The reaction of nanocrystal suspension to THF to heptane may be adjusted based on the nanocrystal concentration in the suspension. This causes the precipitation of the nanocrystals which are then centrifuged. After centrifugation and the decanting of the supernatant, additional amounts of THF or PGMEA is added to disperse the nanocrystals followed by addition of heptane. Heptane to THF or PGMEA ratio may be 2:1 or 3:1. Cycles of sonication, centrifugation and decantation is repeated 2-5 times to purify the nanocrystals.

ZnO Nanocrystals

As-synthesized, capped and/or cap-exchanged zinc oxide nanocrystals may be purified or further purified to obtain an optically clear suspension in a polar solvent. This process removes at least part of the by-product of the synthesis or cap exchange reactions. An exemplary method of purifying the ZnO nanocrystals is as follows: A suspension of 200 ml zinc oxide nanocrystals in ethanol (~1 g ZnO) is mixed with 400-500 milliliters of heptane to form a white precipitate which is collected by centrifugation, followed by decanting and discarding the supernatant. A sample of 20-60 milliliters of ethanol is then used to redisperse the white precipitate into solution with 5 minutes of ultrasonication, and a sample of 40-50 milliliters of heptane was used again to precipitate the product. After collecting the white precipitate by centrifugation, the decanting and discarding of the supernatant was repeated for a second time. The ethanol redispersion/heptane precipitation procedure was repeated twice more to obtain a purified nanocrystals.

In a further example, capped zinc oxide nanocrystals were purified to obtain re-dispersable dry powders. A suspension of 200 ml organosilane capped zinc oxide nanocrystals in ethanol (~1 g ZnO) was mixed with 400-500 ml of heptane to form a white precipitate. This white precipitate was collected by centrifugation, followed by the decanting and discarding of the supernatant. A sample of 20 ml of ethanol was then used to redisperse the white solid, with the aid of 5 minutes of ultrasonication. 40-50 ml of heptane was used to once again precipitate the product. After collecting the white precipitate by centrifugation, and decanting and discarding the supernatant for a second time, the ethanol redispersion/heptane precipitation procedure was repeated, preferably, twice more. A sample of 5 ml of pentane was then added to the washed organosilane capped ZnO nanocrystals and ultrasonicated for 5 minutes. The resulting mixture was then centrifuged again and the precipitate was again collected. After discarding the supernatant, the solid was dried in air or under vacuum, resulting in a dry white precipitate which is a ZnO nanocrystalline powder.

Another method of purifying the as-synthesized organosilane capped zinc oxide nanocrystals to obtain an optically clear suspension in a polar solvent is provided. When 1.6 L of the as prepared organosilane capped zinc oxide nanocrystal/ethanol suspension, containing >8 g ZnO, is mixed with 3.2-4.0 L of heptane, a white precipitate forms. This white precipitate is collected by centrifugation, followed by the decanting and discarding of the supernatant. A sample of 60 ml of ethanol is then used to redisperse the white precipitate with the aid of 5 minutes of ultrasonication. 120-150 ml of heptane are used again to precipitate the product. After collecting the white precipitate by centrifugation, followed by decanting and discarding the supernatant for a second time, ~8 g of organosilane capped ZnO nanocrystals are obtained. To achieve even higher purity the ethanol redispersion/heptane precipitation procedure is repeated twice more resulting in a white precipitate.

$Y_2O_3$ Nanocrystals

The purification of as-synthesized $Y_2O_3$ nanocrystals may involve the following: As-synthesized reaction mixture was precipitated with addition of 4:1 volume percent ethanol to the reaction mixture. The suspension was centrifuged at 9000 rpm for 20 minutes and afterwards the supernatant was decanted and discarded while the precipitate was collected. This precipitate was then suspended in 2 ml of chloroform via sonication (>1 minute) and re-precipitated by the addition of 2 ml of ethanol. The suspension was centrifuged at 9000 rpm for 30 minutes, after which the supernatant was again decanted and discarded while the precipitate was collected. The precipitate was dispersed in 3 ml of hexane via sonication (>2 minutes) and re-precipitated with 2 ml of ethanol, where the supernatant was decanted and discarded while the precipitate was collected. The redispersion-precipitation procedure using hexane and ethanol was repeated once more. After this purification procedure, the yttrium oxide nanocrystals can be dispersed into a number of solvents, such as chloroform, hexane, toluene and tetrahydrofuran.

The purification of the $Y_2O_3$ nanocrystals after the cap exchange reaction may involve the following: The nanocrystals were precipitated with pentane and centrifuged at 9000 rpm for 20 minutes. The precipitate was re-dispersed in tetrahydrofuran, precipitated with hexane and centrifuged at 9000 rpm for 20 minutes to remove the excess capping agent and by-products. The precipitate can be dispersed into a variety of solvents, such as tetrahydrofuran, chloroform and toluene and mixtures of solvents such as hexane and ethanol.

Example 5

Nanocomposite Formation

Formation of Nanocomposites Suspensions and Nanocomposite Layers from Capped ZnO Nanocrystals and Polymers Capped and purified ZnO nanocrystals, in the form of a white precipitate or nanocrystalline powders, may be dispersed in a number of polar solvents, including, but not limited to, tetrahydrofuran, ethanol, methanol, acetonitrile, PGMEA, PGME, PGPE, ethyl lactate, cyclic ketones and acetone, to form optically transparent suspensions. These optically transparent suspensions can be mixed with various polymer solutions to form uniformly dispersed ZnO/polymer nanocomposites using solvent mixing. The dispersion solvent for the nanocrystals may be selected based on the chemical compatibility of the capping agent and the polymer. A solvent system that is suitable for dispersing both the nanocrystals and the polymer is preferred. To form the composite solution in the desired nanocrystal to polymer ratio, the nanocrystals that are dispersed in the selected solvent are mixed with a separately prepared solution of the polymer preferably in the same solvent or a different solvent, or a combination of solvents compatible with the selected solvent. These polymers include, but are not limited to, PMMA, JSR topcoat, JSR Micro (CA) brand acrylate based photoresists, Honeywell spin-on glass polymers (silicon based polymer, from Honeywell Electronic Materials, CA), PEO (polyethylene oxide), epoxy resins, silicones such as Polydimethylsiloxane (PDMS) and polymethylphenylsiloxane, and epoxy resins.

An exemplary method of forming a nanocomposite suspension provides mixing a sample of 38 milligrams of purified capped ZnO nanocrystal powder with 0.5 grams of Honeywell Electronic Material (HEM) Spin-on-Glass (SOG) polymer/ethanol solution (HW SOG, solid content is 1-5% by weight). This mixture was ultrasonicated for 30 minutes, resulting in an optically transparent suspension.

Similarly, highly transparent films were obtained with epoxy or acrylic polymers or spin-on-glasses and $ZrO_2$ nanocrystals with 5 nm average size. The nanocrystal weight loading can be varied from 0.01 to 90 percent, resulting in an optically transparent suspensions and films.

A suspension of capped ZnO nanocrystals with average particle size of 3 to 4 nm mixed with SOG in ethanol was used to prepare a nanocomposite film by spin-coating the suspension on a 2 inch quartz disc at a spin rate of 500 rpm to determine the film uniformity of the resulting nanocomposite. UV-Vis spectroscopy was used to measure the optical density (OD) of the film at different spots along 3 radial directions. The center of the disc was marked as 0 mm and measurements were taken at 0, 3, 5, 8, 12, 16, and 20 mm from the center. The exciton peak showed a maximum at 330 nm and the deviation in the OD at 330 nm was less than 2.0% for all the measurement.

Figure 17:
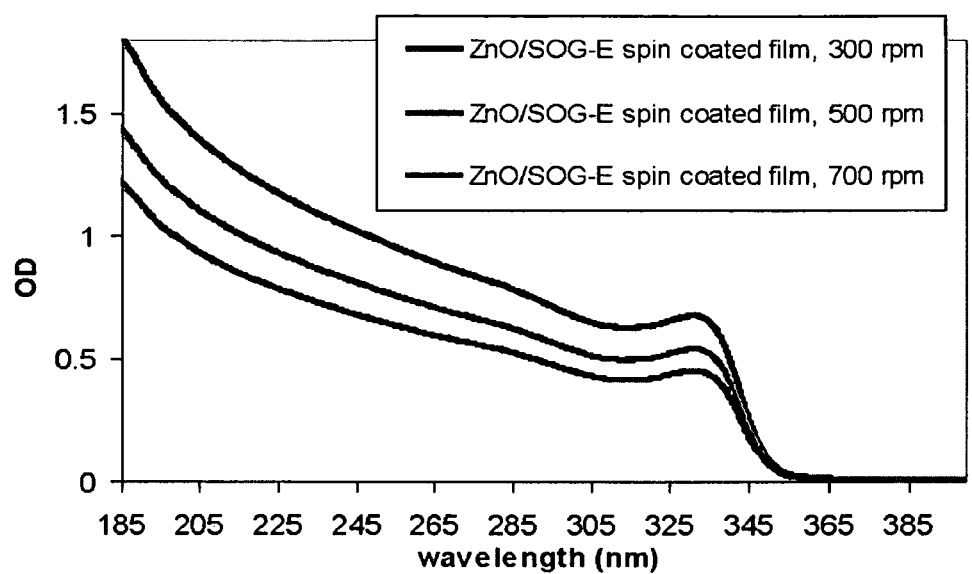
FIG. 17 shows the UV-Vis spectra of a ZnO/SOG nanocomposite spin coated films.

The suspension of capped ZnO nanocrystals mixed with SOG in ethanol was also used to spin-coat a film on three 1" quartz discs at 300, 500 and 700 rpm respectively. These films were baked at 80° C. for 1 minute in air in order to remove residual ethanol. The resultant films were visually transparent with no apparent haze or opaqueness. The nominal loading of ZnO nanocrystals in the SOG polymer nanocomposite was measured to be 72.0% by weight, as calculated from the nanocomposite composition. FIG. 17 shows the UV-Vis spectra of the resulting films. These nanocomposite films all have a band gap maximum at around 330 nm wavelength corresponding to the exciton peak of ZnO. As the spin rate at which the film was cast increased from 300 rpm to 700 rpm, the optical density (OD) of the films decreased due to the decreasing film thickness. The nanocomposite films are highly transparent at visible wavelengths, as indicated by the lack of scattering above 350 nm and sharp exciton peaks in the UV-Vis spectra.

Figure 18:
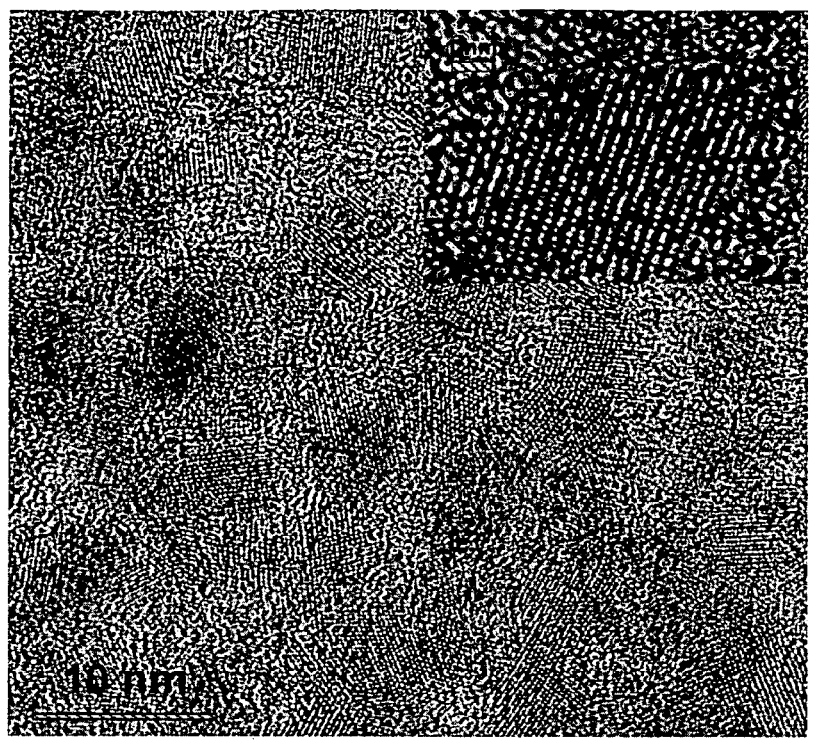
FIG. 18 shows the TEM images of a ZnO/PMMA nanocomposite.

A method of forming a nanocomposite includes solvent mixing purified capped zinc oxide nanocrystals of the present disclosure with PMMA in tetrahydrofuran. The purified capped ZnO nanocrystals were dispersed in tetrahydrofuran and then mixed with a PMMA/THF solution. FIG. 18 shows the TEM of the nanocomposite that was spin coated on a Cu TEM grid. The scale bar on the TEM image is 10 nm and the 4-5 nm capped ZnO nanocrystals are uniformly dispersed into the PMMA matrix without forming any aggregates. The inset shows a close-up of a single nanocrystal in the nanocomposite.

The organosilane capped ZnO nanocrystals dispersed in PMMA/THF solution was used to prepare a nanocomposite film by spin-coating on a 2 inch silicon wafer at a spin rate of 500 rpm. The film thickness measurements were done by Dektak profilometer. For this measurement periodic scratches were made on the film to determine the film thickness. A 1 mm distance was measured showing a uniform film thickness of ~300 nm with a thickness variation of <3% over this range.

Another example of a method of forming a nanocomposite of the present disclosure includes dispersing purified capped zinc oxide nanocrystals of the present disclosure with an epoxy polymer in tetrahydrofuran. 500 mg of as-purified organosilane capped ZnO nanocrystals were dispersed into 2 ml tetrahydrofuran and mixed with 1.5 g epoxy, EPON™ Resin 862 (Diglycidyl Ether of Bisphenol F) which is a low viscosity, liquid epoxy resin and 0.3 g Epikure™ W (Epikure W is an aromatic diamine curing agent for epoxy resin) curing agent. The mixture was transferred into a mold and cured for 12 hours, and then post-cured at 150° C. for 3 hours.

Another example of a method of forming a nanocomposite of the present disclosure includes mixing resin EPON 862 and curing agent W (or curing agent 3295) by hand using a weight ratio of 5:1. To this mixture ZnO or $ZrO_2$ capped with methoxytri(ethyleneoxy)propyltrimethoxysilane is then added. The weight ratio of the nanocrystals to the epoxy mixture can be range from 1:1000 to 10:1. A small amount of THF (no more than 200 wt % of the composite mixture) was added to reduce the viscosity of the nanocrystal/epoxy resin mixture. The mixture is then sonicated either inside a sonication bath or using a Hielscher UP200S sonication probe for less than five minutes. After sonication, the composite mixture (2 gram to 4 grams) was then poured into an aluminum pan (4 cm diameter), which acted as a mold. The loaded pan was and placed inside a vacuum oven. Vacuum was applied in order to remove the THF and air bubbles. The oven was then heated to 80° C. for overnight (>10 hr) under vacuum. The resulting composite was post cured at 150° C. for another 3 hours before it was removed from the vacuum oven.

Another example of a method of forming a nanocomposite of the present disclosure may be as follows: epoxy resin EPON 862 and curing agent 3274 were pre-mixed by hand using weight ratio of 10:4. 3-(methacryloyloxy)propyl trimethoxysilane capped $ZrO_2$ nanocrystals are then added into the epoxy resin at loading levels between 0.01-99.99 wt %. A small amount of acetone (no more than 200 wt % of the composite mixture) was added to reduce the viscosity of the nanocrystal/epoxy resin mixture. The mixture is then sonicated either inside a sonication bath or using a Hielscher UP200S sonication probe for less than five minutes. The mixed composite mixture (2 gram to 4 grams) was then poured into an aluminum pan (4 cm diameter), which acted as a mold. The loaded pan was then placed inside a vacuum oven. Vacuum was applied to remove the acetone and air bubbles. The resulting composite was cured at room temperature for 24 hours before it was removed from the vacuum oven.

For spin coating 3-(methacryloyloxy)propyl trimethoxysilane capped nanoparticle/epoxy composite films, a typical protocol is described as follows: epoxy resin EPON 862 and curing agent 3274 were pre-mixed by hand using weight ratio of 10:4. The desired amount of capped nanocrystals is then added into the epoxy resin at loading levels between 1-99.99 wt %. Acetone was added to prepare a spin solution with an appropriate solid content (ranging from 10 wt % to 50 wt %). The mixture is then sonicated inside a sonication bath for 5 minutes. The solution can then be used directly for spin-coating. By varying the spin-rate different film thicknesses ranging from several hundred nanometers to several micrometers may be achieved.

Another example of forming a nanocomposite of the present disclosure includes solvent mixing of purified capped zinc oxide nanocrystals of the present disclosure with a photoresist from JSR Micro Inc. The as-purified capped ZnO nanocrystals were dispersed into PGMEA to form a clear suspension and JSR photoresist solution is mixed with this suspension. The resultant suspension forms a nanocomposite film after spin coating on a surface.

In a further example, a nanocomposite of the present disclosure is formed by solvent mixing purified capped zinc oxide nanocrystals of the present disclosure with a topcoat polymer from JSR Micro Inc. The as-purified organosilane capped ZnO nanocrystals were dispersed in 4-methyl-2-pentanol which was also the solvent in the JSR topcoat polymer solution. The nanocrystal suspension was mixed with the topcoat solution to form a dispersion which can be used to form a nanocomposite film by spin-coating on a surface.

The method of the disclosure includes dispersing the purified capped zinc oxide nanocrystals in water. The as-purified capped ZnO nanocrystals were dispersed into water by mixing the wet precipitate of ZnO after purification and water to form a clear suspension by sonication. This suspension was mixed with JSR aqueous topcoat solution (NFC 545-34).

Figure 19:
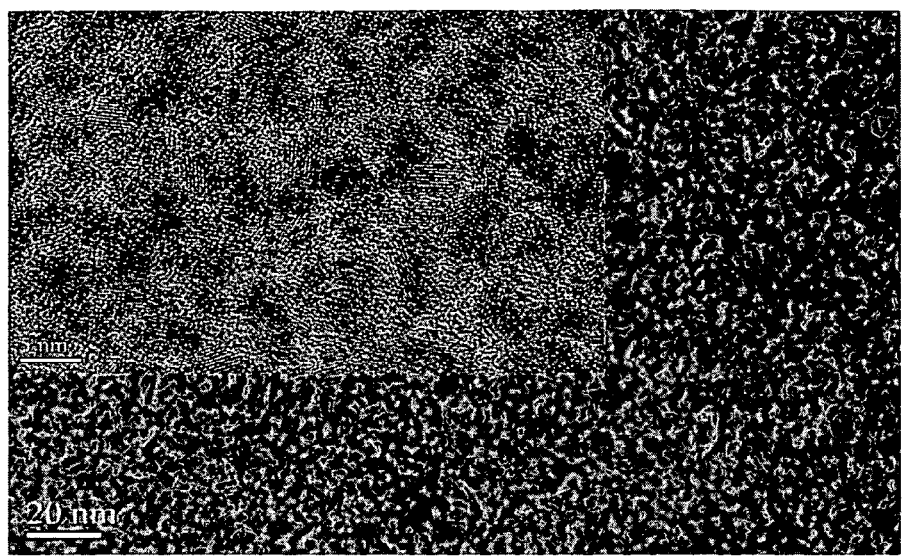
FIG. 19 shows the TEM images of a $HfO_2$/SOG nanocomposite.

In a further example, a nanocomposite of the present disclosure is formed by dispersing methoxytri(ethyleneoxy) propyltrimethoxysilane capped $HfO_2$ nanocrystals in ethanol to form a suspension and mixing this suspension with a SOG/ethanol solution. FIG. 19 shows the TEM images of the nanocomposite prepared by spin coating the suspension on a Cu TEM grid. The figure inset shows a close up of the nanocrystals. These images show that the 4-5 nm rice-shaped $HfO_2$ nanocrystals were uniformly dispersed in the SOG matrix with no visible aggregate formation.

Figure 20:
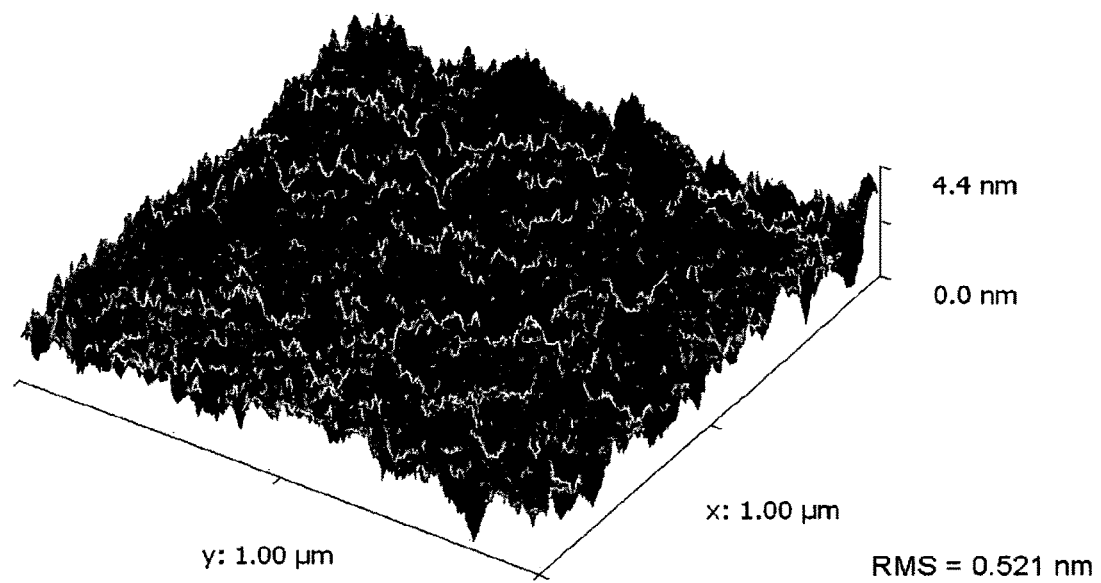
FIG. 20 shows surface roughness of a $ZrO_2$ film as measured by AFM.

A further example of forming a nanocomposite of the disclosure involves dispersing methoxytri(ethyleneoxy)propyltrimethoxysilane capped $ZrO_2$ nanocrystals of the disclosure and an acrylate based polymer in a mixture of PGMEA and PGME to form a nanocomposite suspension. Films of this suspension are made by spin coating on quartz discs and silicon wafers. The loading of the nanocrystals in the polymer matrix is up to 80 wt %. The films are made after the nanocomposite suspension is filtered through a 200 nm filter. FIG. 20 shows the AFM image indicating the surface roughness of a nanocomposite film prepared by spin coating the suspension on a quartz disc. The Root Mean Square (RMS) roughness value for this film was 0.521 nm.

In-Situ Polymerization

Nanocomposite of $ZrO_2$ nanocrystals and polymethyl methacrylate can be prepared by in-situ polymerization of methyl methacrylate (MMA) and nanocrystals which are at least partially capped with 3-(methacryloyloxy)propyl trimethoxysilane. A typical synthesis protocol of the nanocomposite is described as follows: 500 mg MMA and 2 mg AIBN are dissolved in 9 g toluene and the solution is heated to 100° C. 0.5 g of $ZrO_2$ nanocrystals capped with a mixture of both 3-(methacryloyloxy)propyl trimethoxysilane and methoxytri(ethyleneoxy)propyltrimethoxysilane is dispersed in 1 g of THF. This dispersion is added into the MMA/toluene solution drop-wise. The mixture was maintained at 100° C. for 16 h. The reaction mixture is slightly cloudy. The resulting precipitate is collected by anti-solvent precipitation using methanol. The precipitate is then redispersed into THF to form a 12 wt % dispersion. Approximately 38 wt % of the solid content of this dispersion is from the capping agents and the PMMA according to thermogravimetric analysis (TGA) of the product.

Another example of nanocomposite formed by in situ polymerization of $ZrO_2$ nanocrystals and polymethyl methacrylate is as follows: 9 g of toluene is heated to 100° C. 0.5 g 3-(methacryloyloxy)propyl trimethoxysilane and methoxytri(ethyleneoxy)propyl trimethoxysilane capped $ZrO_2$ nanocrystals, 0.5 g MMA and 2 mg AIBN are added to 1 g THF. This mixture is added into the hot toluene drop-wise. The mixture was maintained at 100° C. for 16 h, after which the reaction mixture is slightly cloudy. The resulting nanocomposite is collected by anti-solvent precipitation using methanol. The precipitate is then redispersed into THF to form a 5 wt % dispersion. Approximately 31 wt % of the solid content of this dispersion is due to the capping agents and the PMMA according to TGA of the product.

The invention claimed is:

1. An organic light emitting diode (OLED) display comprising,
in order:
a planarization layer,
an array of lenses, and
an array of light emitting pixels, wherein
the array of lenses comprise a nanocomposite having a refractive index in the range of greater than 1.7 to 1.9 at 400 nm, the nanocomposite comprising inorganic nanocrystals and a polymeric matrix, wherein the refractive index of the nanocrystals is greater than the refractive index of the polymeric matrix; and wherein
the planarization layer has a refractive index that is less than the refractive index of the nanocomposite; and wherein
at least one of the lenses is arranged so as to enhance overall light extraction efficiency from at least one pixel.

2. The OLED display of claim 1, further comprising an encapsulation or a substrate layer in contact with the planarization layer on a surface of the planarization layer opposite a surface facing the array of light emitting pixels.

3. The OLED display of claim 1, wherein the nanocomposite is UV curable.

4. The OLED display of claim 1, wherein the nanocomposite is thermally curable.

5. The OLED display of claim 1, wherein the nanocomposite comprises $ZrO_2$, $TiO_2$, $ZnO$, $MgO$, $HfO_2$, $Nb_2O_5$, $Ta_2O_5$, or $Y_2O_3$ nanocrystals.

6. The OLED display of claim 5, wherein the nanocrystals have a size of less than 10 nm in at least one dimension.

7. The OLED display of claim 5, wherein the nanocomposite comprises a polymer, and wherein the polymer optionally comprises an acrylic, an epoxy or a silicone.

8. The OLED display of claim 7, wherein the polymer comprises a siloxane, a polycarbonate, a polyurethane, a polyimide, poly(3,4-ethylenedioxythiophene) (PEDOT), poly(styrene sulfonate) (PSS), polyethylene terephthalate (PET), polyethylene naphthalate (PEN), or poly(4,4-dioctylcyclopentadithiophene).

9. The OLED display of claim 1, wherein at least one of the lenses covers a single pixel.

10. The OLED display of claim 1, wherein at least one of the lenses covers multiple pixels.

11. The OLED display of claim 1, wherein a lens of the array of lenses comprises a spherical surface, a semi-spherical surface, a hyper-hemispherical surface or a parabolic surface.

12. The OLED display of claim 1, wherein a lens of the array of lenses comprises a concave surface, a convex surface, a sub-wavelength pyramid array surface or a textured surface.

13. The OLED display of claim 1, wherein a lens of the array of lenses comprises a graded or gradient index profile along at least one dimension of the lens.

14. The OLED display of claim 1, wherein the array of lenses is separated from the array of light emitting pixels by a distance of less than the wavelength of the highest energy photons emitted by the array of pixels.

15. The OLED display of claim 1, wherein the nanocrystals are at least partially capped.

16. An organic light emitting diode (OLED) display comprising,
in order:
an array of lenses, and
an array of light emitting pixels, wherein
the array of lenses comprises a nanocomposite, wherein the nanocomposite comprises inorganic nanocrystals and a polymeric matrix, the nanocomposite having a refractive index between 1.6 and 1.9 at 400 nm, wherein the refractive index of the nanocrystals is greater than the refractive index of the polymeric matrix; and wherein
at least one of the lenses is arranged so as to enhance overall light extraction efficiency from at least one pixel, and wherein
the array of lenses is not in contact with a planarization layer or a substrate layer.

17. The OLED display of claim 16, wherein the nanocomposite is UV curable.

18. The OLED display of claim 16, wherein the nanocomposite is thermally curable.

19. The OLED display of claim 16, wherein the nanocomposite comprises $ZrO_2$, $TiO_2$, $ZnO$, $MgO$, $HfO_2$, $Nb_2O_5$, $Ta_2O_5$, or $Y_2O_3$ nanocrystals.

20. The OLED display of claim 19, wherein the nanocrystals have a size of less than 10 nm in at least one dimension.

21. The OLED display of claim 16, wherein the nanocomposite comprises a polymer, and wherein the polymer optionally comprises an acrylic, an epoxy or a silicone.

22. The OLED display of claim 21, wherein the polymer comprises a siloxane, a polycarbonate, a polyurethane, a polyimide, poly(3,4-ethylenedioxythiophene) (PEDOT), poly(styrene sulfonate) (PSS), polyethylene terephthalate (PET), polyethylene naphthalate (PEN), or poly(4,4-dioctylcyclopentadithiophene).

23. The OLED display of claim 16, wherein at least one of the lenses covers a single pixel.

24. The OLED display of claim 16, wherein at least one of the lenses covers multiple pixels.

25. The OLED display of claim 16, wherein a lens of the array of lenses comprises a spherical surface, a semi-spherical surface, a hyper-hemispherical surface, or a parabolic surface.

26. The OLED display of claim 16, wherein a lens of the array of lenses comprises a concave surface, a convex surface, a sub-wavelength pyramid array surface, or a textured surface.

27. The OLED display of claim 16, wherein a lens of the array of lenses comprises a graded or gradient index profile along at least one dimension of the lens.

28. The OLED display of claim 16, wherein the array of lenses is separated from the array of light emitting pixels by a distance of less than the wavelength of the highest energy photons emitted by the array of pixels.

29. The OLED display of claim 16, wherein the nanocrystals are at least partially capped.

* * * * *